US006661823B1

(12) United States Patent
Otoma et al.

(10) Patent No.: US 6,661,823 B1
(45) Date of Patent: Dec. 9, 2003

(54) VERTICAL RESONATOR TYPE SURFACE LIGHT EMITTING SEMICONDUCTOR LASER DEVICE AND FABRICATION METHOD THEREOF

(75) Inventors: Hiromi Otoma, Sagamihara (JP); Ryoji Ishii, Machida (JP); Jun Sakurai, Ebina (JP); Yasuaki Miyamoto, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 229 days.

(21) Appl. No.: 09/718,479

(22) Filed: Nov. 24, 2000

(30) Foreign Application Priority Data

Apr. 19, 2000 (JP) .................................... 2000-117973
Oct. 5, 2000 (JP) .................................... 2000-306804

(51) Int. Cl.[7] ................................................. H01S 5/00
(52) U.S. Cl. ............................ 372/49; 372/43; 372/45; 372/46; 372/50
(58) Field of Search ............................ 372/96, 92, 45, 372/46, 50, 49, 43, 29.013, 103

(56) References Cited

U.S. PATENT DOCUMENTS 5,328,854 A * 7/1994 Vakhshoori et al. .......... 437/24

OTHER PUBLICATIONS

*IEEE Journal of Quantum Electronics*, vol. 27, p. 1332, 1991.
*Journal of Applied Electronic Physical Properties Study Group*, vol. 5, Issue 1, p. 11, 1999.

* cited by examiner

*Primary Examiner*—Paul Ip
*Assistant Examiner*—Armando Rodriguez
(74) *Attorney, Agent, or Firm*—Oliff & Berridge, PLC

(57) ABSTRACT

A vertical resonator type surface light emitting semiconductor laser device includes a semiconductor substrate having formed thereon a first semiconductor multi-layered film reflection mirror, an active layer, a second semiconductor multi-layered film reflection mirror, and a contact electrode having an opening for emitting laser light. The opening is covered with a protective film for preventing damage during fabrication after the contact electrode has been formed. Or, the protective film is provided on the second semiconductor multi-layered film reflection mirror so that the contact electrode is superimposed on the surface of the protective film, and the opening is formed on the protective layer. In this way, there is provided a vertical resonator type surface light emitting semiconductor laser device having high reliability, capable of stably producing laser light with a low resistance and a high output, which output does not decrease over time.

11 Claims, 28 Drawing Sheets

VERTICAL RESONATOR TYPE SURFACE LIGHT EMITTING SEMICONDUCTOR LASER DEVICE AND FABRICATION METHOD THEREOF

BACKGROUND OF THE INVENTION

1. Field of the Invention

The present invention relates to a surface light emitting semiconductor laser device employed for optical interconnection, optical exchange, or optical information processing, and to a fabricating method thereof.

2. Description of the Related Art

In recent years, research has advanced on optical interconnections, which aim for remarkable improvements in transmission speed, as information transmitting means of logical circuit elements. As a parallel light source thereof, attention has been paid to a surface light emitting laser (vertical cavity surface emitting laser diode, hereinafter, referred to as "VCSEL") in which light emitting elements can be arranged in a two-dimensional manner at a high density. Iga, et al. have conducted advanced research on VCSELs, as described in IEEE Journal of Quantum Electronics, Volume 27, page 1332 issued in 1988.

The latest VCSEL has the structure shown in FIGS. 7A and 7B. That is, a resonator 302 is provided in a vertical direction with respect to a horizontal face of a semiconductor substrate 301. The resonator 302 is formed by: an active layer 303 that confines a carrier to generate a light; a lower reflection mirror 304 formed by a semiconductor multi-layered film; an upper reflection mirror 305 formed by a semiconductor multi-layered film; and a spacer layer 306 for aligning a phase of the light emitted in the active layer with ends of both of the upper and lower semiconductor multi-layered reflection mirrors. As a constituent element other than the resonator, there are provided an upper contact layer 307, an upper electrode 308 that also functions as a laser emitting port, an inter-layer insulating film 310, and a lower electrode 309.

In order to oscillate a laser, it is required to confine a carrier and light in the horizontal direction of the carrier 301 (that is, in a direction parallel to a plane including the substrate). As a means for fabricating a substrate 301 and a narrow structure in the horizontal direction, there are provided a method of fabricating a thin columnar (post) structure of several tens of microns by dry etching to form the post section itself as a current path (single post type); a method of fabricating such a post structure, and then making a portion of an AlAs oxide layer insulated by steam oxidization, thereby limiting a current path (AlAs oxidation type); and a method of forming an insulation region by a proton impeller, thereby limiting a current path (proton impeller type).

At present, it is known that a VCSEL having a low threshold current value and excellent current-light characteristics can be fabricated by AlAs oxidization (Journal of Applied Electronics Physical Properties Study Group, Volume 5, Issue 1, 1999, page 11). Reference numeral 312 in FIG. 8 denotes an AlAs layer; 312A denotes an oxide region; and 312B denotes a non-oxide region. An opening 313 is provided at the upper electrode 308 to form a laser emitting port.

There are the following problems with the foregoing conventional VCSEL.

That is, first, the contact resistance of the upper electrode 308 is large. Second, the light output of the device is gradually lowered as power is supplied, and reliability is very low. It was found that these two problems are caused by a GaAs contact layer being thin (several nm to several tens of nm).

In an end face light emitting laser or in a VCSEL having a wavelength of 850 nm or longer, the thickness of the GaAs contact layer, which is the top surface layer of a substrate contacted by the upper electrode, is usually 50 nm to several hundreds nm. In a VCSEL having a short wavelength bandwidth such as a VCSEL with a 780 nm bandwidth, if the GaAs contact layer is thick, the light absorption in that layer increases, and the threshold current value is significantly increased. Therefore, in order to restrict light absorption and obtain practical characteristics, the thickness of the GaAs contact layer is reduced to about several nm or several tens of nm.

On the other hand, during the processes of fabricating a VCSEL, the GaAs contact layer that is the top surface layer is exposed to a variety of process environments, and is easily damaged. For example, in VCSEL fabrication, several steps of film-depositing, such as film-depositing an SiO film by a CVD method onto the GaAs contact layer surface, are carried out. At this time, separation of As from the GaAs top layer is promoted by exposure to the CVD plasma gas or by heating. The GaAs located at a depth of several tens of nm from the top layer is transformed into a layer having poor stoichiometry, or crystalline defects arise. In the subsequent contact hole forming step, this GaAs transformed layer is exposed to a buffered fluoric acid. In general, although GaAs is not easily etched by buffered fluoric acid, this GaAs transformed layer is etched. Here, in the case where the GaAs contact layer is as thick as one hundred nm, several tens of nm of the damaged layer is merely eliminated. In the case where a contact layer in an VCSEL of a 780 nm bandwidth is originally as thin as several tens of nm, all of the GaAs contact layer is etched and disappears, and the lower AlGaAs layer is exposed.

When an upper electrode is formed on the surface of the AlGaAs layer that appears when the GaAs contact layer disappears, the contact resistance increases, and the voltage (drive voltage) required for driving the device increases. In addition, although an opening of the upper electrode serves as a light emitting port, AlGaAs is produced on the surface of the emitting port. Thus, this AlGaAs reacts with the oxygen or moisture in air, and AlGaAs is oxidized and blackened (this is referred to as a "AlGaAs blackening phenomenon"). In particular, this blackening phenomenon rapidly progresses by supplying power. As a result, the laser light to be emitted from the emitting port is absorbed by the AlGaAs oxide layer whose top surface has blackened, and making the light output is lowered.

In general, making the GaAs contact layer thicker prevents the GaAs contact layer from disappearing, but on the other hand, light absorption increases. In addition, after the foregoing processes have been completed, the GaAs is eliminated, the GaAs film thickness deviate from the design value therefor, and the reflectance of the reflection mirror is reduced. As a result, the threshold current value of the device is increased.

Along with the above-described two problems, according to the foregoing conventional VCSEL, there is a third problem that the GaAs contact layer is etched by a resist developing liquid employed in the photolithography step when a contact electrode is formed.

That is, as described above, in a VCSEL with a short wavelength bandwidth such as a VCSEL with a 780 nm bandwidth, in the case where the GaAs contact layer is thickened, light absorption in the layer is increased and the threshold current value of the device is significantly increased. Therefore, the GaAs contact layer is reduced to some nm or several tens of nm.

However, in a VCSEL contact layer employing Au for an electrode metal, in general, the layer is often formed by a method in which a negative pattern resist is formed, the electrode metal is film deposited, and then the layer and the negative pattern resist are lifted off. In this case, as shown in FIGS. 18A to 18C, a GaAs contact layer 401 comes into direct contact with the resist developing liquid, and thus, is etched by the developing liquid (reference numeral 404 in the figure). As in the previously described case, in particular, in the case where the GaAs contact layer is several tens of nm, which is very thin, all of the GaAs contact layer 401 may be etched and disappear depending on the developing conditions, such that a lower layer AlGaAs 402 is exposed. Even if the AlGaAs is not fully exposed, the thickness of the GaAs contact layer differs per processed batch, and dispersion in contact resistance value occurs between VCSELs processed in different batches.

In the case where contact electrodes 405 are formed on the AlGaAs layer surface that appears after this GaAs contact layer has disappeared, the contact resistance increases, and the device driving voltage increases. In addition, in the case where GaAs remains in a very thin film, the film thickness of the remaining film differs depending on the sample, and thus, a dispersion in electrode characteristics occurs.

On the other hand, a portion close to an electrode metal at an opening 406 of a contact electrode is a region that cannot be fully covered with a resist. This region is etched in actual contact with the developing liquid. If GaAs of a partial region 407 in the electrode opening 406 is thus etched, the inside of the opening is easily transformed in the subsequent process. Then, the etching of the top layer progresses or the top layer is oxidized. Moreover, after the device has been completed, the device reacts with the oxygen or moisture in air, and the oxidization of AlGaAs progresses, inducing the same AlGaAs blackening phenomenon as described above. If the blackening phenomenon in the emitting port occurs, the laser light to be emitted from the emitting port is absorbed by the blackened emitting port surface, resulting in lowered light output.

As has been described above, even in a VCSEL of a short wavelength bandwidth in which a contact layer is originally as thin as several tens of nm, such as VCSEL with a 780 nm wavelength bandwidth, there has not yet been provided a vertical resonator type surface light emitting semiconductor laser device having high reliability, low resistance and stable characteristics of avoiding an increase in contact resistance, dispersion in electrode characteristics, and a blackening phenomenon due to damage such as erosion or elimination of the contact layer formed of GaAs, and which is capable of producing a high output of laser light which does not decrease over time.

SUMMARY OF THE INVENTION

The present invention has been achieved to solve the foregoing conventional problems and to achieve the following objects.

That is, it is an object of the present invention to provide a vertical resonator type surface light emitting semiconductor laser device with having reliability, and capable of achieving high output at a low resistance, and capable of stably producing laser light whose output does not decrease over time.

It is another object of the present invention to provide a surface light emitting semiconductor laser device fabricating method capable of fabricating a vertical resonator type surface light emitting semiconductor device having high reliability and capable of stably maintaining a high laser output.

As a result of earnest studies on techniques for stabilizing laser output of VCSELs of short wavelength bandwidths, the present inventors found that, as described above, a contact layer positioned at an opening (laser emitting port) for emitting a laser is damaged in the process of fabricating the device itself. The damage affects the intensity and stabilization of the laser output, and thus, it is not preferable to stabilize only by avoiding damage incurred during use after the fabrication process has been completed.

Means for solving the foregoing problems is as follows.

According to a first aspect of the present invention, there is provided a vertical resonator type surface light emitting semiconductor laser device comprising a semiconductor substrate having sequentially provided thereon: a first conductivity type semiconductor multi-layered film reflection mirror; an active layer; a second conductivity type semiconductor multi-layered film reflection mirror; and a contact electrode having an opening for emitting laser light, wherein said opening is covered with a protective film for preventing damage due to fabrication after forming said contact electrode.

According to a second aspect of the present invention, there is provided a vertical resonator type surface light emitting semiconductor laser device comprising a semiconductor substrate having thereon: a first conductivity type semiconductor multi-layered film reflection mirror; an active layer; a second conductivity type semiconductor multi-layered film reflection mirror; a protective film; and a contact electrode having an opening for emitting laser light, wherein said contact electrode is provided so as to be superimposed on said protective film, and said opening is formed on the protective layer.

According to a third aspect of the present invention, there is provided a method of fabricating a vertical resonator type surface light emitting semiconductor laser device comprising the step of forming in order on a semiconductor substrate: a first conductivity type semiconductor multi-layered film reflection mirror; a second conductivity type semiconductor multi-layered film reflection mirror; and a contact electrode having an opening for emitting laser light, wherein at least the opening is covered with a protective film immediately after the contact electrode having said opening has been formed.

According to a fourth aspect of the present invention, there is provided a method of fabricating a vertical resonator type surface light emitting semiconductor laser device, said method comprising the step of forming in order on a semiconductor substrate: a first conductivity type semiconductor multi-layered film reflection mirror; a second conductivity type semiconductor multi-layered film reflection mirror; and a contact electrode having an opening for emitting laser light, wherein a sacrifice layer is deposited on a contact layer by a step which is different from a step of forming a wiring electrode bonded with the contact electrode, and a lift-off resist mask is provided on the sacrifice layer, said sacrifice layer is etched with the resist mask disposed thereon, an electrode material is deposited while said resist mask is disposed on the sacrifice layer, and then, said resist mask is lifted off, whereby said contact electrode is formed.

According to a fifth aspect of the present invention, there is provided a method of fabricating a vertical resonator type surface light emitting laser device, said method comprising the step of: sequentially forming on a semiconductor substrate: a first conductivity type semiconductor multi-layered film reflection mirror; an active layer; a second conductivity type semiconductor multi-layered film reflection mirror; and a contact electrode having an opening for emitting laser light, wherein a protective film forming layer for forming a protective film is formed before shaping said second conductivity type semiconductor multi-layered film reflection mirror and forming the contact electrode.

Hereinafter, operation of the above-described vertical resonator type surface light emitting semiconductor laser devices and fabricating methods thereof will be described.

According to the first aspect of the present invention, there is provided a vertical resonator type surface light emitting laser device, wherein, in a step independent of and different from a wiring electrode for power supply, an electrode (contact electrode) bonded to a second conductivity type semiconductor multi-layered film reflection mirror comprises an opening for laser emission, and further, the opening is covered with a protective layer. Thus, the entire surface of the second conductivity type semiconductor multi-layered film semiconductor reflection mirror can be protected from effects from the exterior during use after fabrication as well as during the fabrication process. That is, a wiring electrode and a contact electrode exist independently, and the wiring electrode is connected to and supplies power to the second conductivity type semiconductor multi-layered film reflection mirror via the contact electrode. A patterned protective film is provided, thereby making it possible to form a protective film at an initial stage of the process.

With this structure, there can be avoided an increase in contact resistance due to damage such as erosion or elimination of the surface of the second conductivity type semiconductor multi-layered film reflection mirror made of GaAs, and a blackening phenomenon causing lowered laser output due to blackening. The device can be made to have low-resistance and stable characteristics, and laser light of a high output which is not reduced over time can be stably obtained. Therefore, a device having high reliability and providing a stable supply (of laser light) can be realized.

According to the second aspect of the present invention, there is provided a vertical resonator type light emitting semiconductor laser device, wherein at least a laser emitting region of a second conductivity type semiconductor multi-layered film reflection mirror can be protected from effects from the exterior during use after fabrication as well as during the fabrication process. That is, with this structure, there can be avoided an increase in contact resistance due to damage such as erosion or elimination of the exposed second conductivity type semiconductor multi-layered film reflection mirror and a blackening phenomenon causing lowered laser output due to blackening. The device can be made to have low-resistance and stable characteristics, and laser light of a high output which is not reduced over time can be stably obtained. Therefore, a device having high reliability and providing a stable supply of laser light can be realized.

According to the third aspect of the present invention, there is provided a method of a fabricating a vertical resonator type surface light emitting semiconductor laser device, wherein a protective film is formed immediately after a contact electrode has been formed on a second conductivity type semiconductor multi-layered film reflection mirror or a contact layer (that is, after at least a first semiconductor multi-layered film reflection mirror, an active layer, a second semiconductor multi-layered film reflection mirror, and the contact electrode have been laminated and before there is formed any structure, other than a sacrifice layer described later, of a plurality of structures finally formed on the second conductivity type semiconductor multi-layered film reflection mirror). Moreover, the subsequent steps are completed without causing the protective film to be fully removed. Thus, damage such as erosion or elimination of a contact layer, which damage may be caused during the fabrication process, and in particular, during the step of forming an insulating film or the step of forming the contact hole, can be prevented in particular.

As a result, there can be constantly produced a vertical resonator type surface light emitting semiconductor laser device (hereinafter, occasionally referred to as a "device") that can avoid an increase in contact resistance or a reduction in laser output due to the blackening (blackening phenomenon) of an emitting port, and that provides low-resistance and stable characteristics, and that can stably produce laser light with high output that does not decrease over time.

The reliability of a VCSEL with a short wavelength bandwidth and comprising a thin film contact layer, such as VCSEL of a 780 nm wavelength bandwidth, can be improved.

According to the fourth aspect of the present invention, there is provided a method of fabricating a vertical resonator type surface light emitting semiconductor laser device enabling more stable fabrication of a device that avoids a blackening phenomenon that causes an increase in contact resistance, dispersion in electrode characteristics, and lowered laser output due to blackening accompanying damage such as erosion or elimination of the second conductivity type semiconductor multi-layered film reflection mirror due to contact with a developing liquid employed during the fabrication process (and in particular, during resist developing), which device has low-resistance and stable characteristics, and can stably produce laser light at a high output that does not decrease over time.

As in the third embodiment, the reliability of a VCSEL with a short wavelength bandwidth and comprising a thin film contact layer, such as VCSEL of a 780 nm wavelength bandwidth, can be improved.

According to the fifth aspect of the present invention, there is provided a method of fabricating a vertical resonator type surface light emitting semiconductor laser device, wherein a protective film is primarily provided in a laser emitting region. Thus, as in the third and fourth aspects, there can be more stably produced a device that avoids a blackening phenomenon that causes an increase in contact resistance, dispersion in electrode characteristics, and lowered laser output due to blackening caused by damage such as erosion or elimination of the second conductivity type semiconductor multi-layered film reflection mirror during contact with a developing liquid employed during the fabrication process (and in particular, during resist developing), which device has low-resistance and stable characteristics, and can stably produce laser light at a high output that does not decrease over time.

As has been described above, according to the present invention, there can be provided a vertical resonator type surface light emitting semiconductor laser device having high reliability and capable of producing laser light with a high output due to application of a low voltage under a low resistance, and moreover, capable of producing laser light with a stable output that does not decrease over time.

In addition, according to the present invention, there can be provided a method of fabricating a surface light emitting semiconductor laser device which enables fabrication of a vertical resonator type surface light emitting semiconductor laser device having high reliability and able to maintain a high and stable laser output.

DETAILED DESCRIPTION OF THE PREFERRED EMBODIMENTS

Figure 1A:
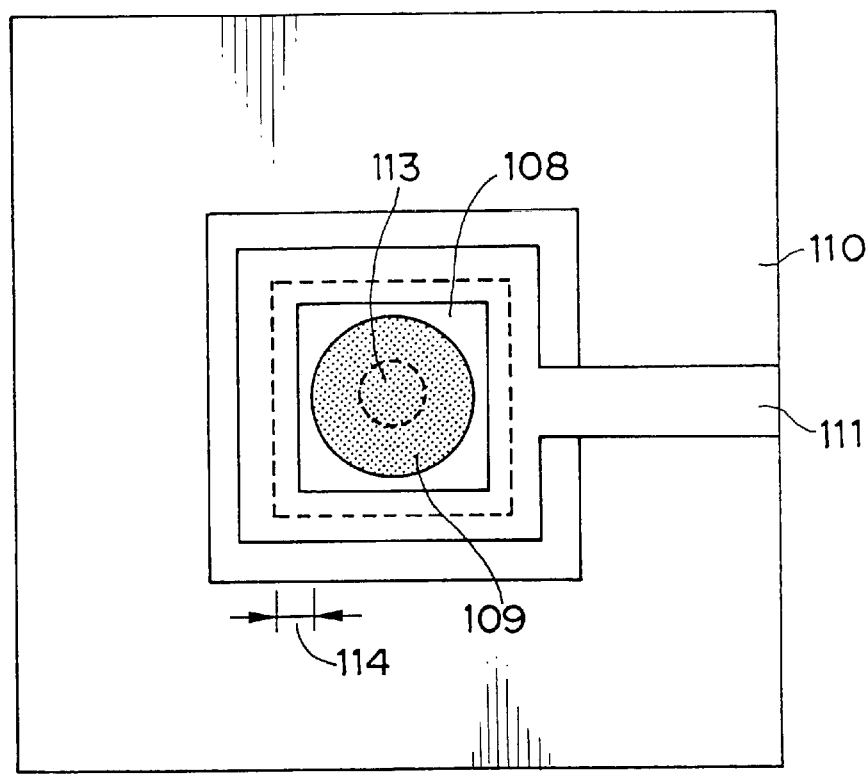
FIGS. 1A and 1B are top and sectional views showing an example of a vertical resonator type surface light emitting semiconductor laser device according to a first aspect of the present invention.

According to a first embodiment of the present invention, there is provided a vertical resonator type surface light emitting semiconductor laser device, wherein, on a surface of a second conductivity type semiconductor multi-layered film reflection mirror or contact layer, there is provided a contact electrode having an opening on the exposed surface, and a protective film is provided at least at an opening of the contact electrode. According to a second embodiment of the present invention, there is provided a vertical resonator type surface light emitting semiconductor laser device, wherein a contact electrode is provided so as to be superimposed on a second conductivity type semiconductor multi-layered film reflection mirror or on the surface of the protective film formed on a contact layer, and the opening is formed only on the protective layer.

According to third and fourth embodiments of the present invention, there is provided a method of fabricating a vertical resonator type surface light emitting semiconductor laser device, wherein, immediately after a contact electrode having an opening has been formed on the surface of a second conductivity type semiconductor multi-layered film reflection mirror or a contact layer, the opening having the contact layer exposed thereto is fully covered with a protective film, and the sequential steps are completed without the protective film being fully removed. Further, on the contact electrode, in a step different from the step of forming a wiring electrode bonded with the contact electrode, a lift-off resist mask is provided on a sacrifice layer film deposited on the contact layer, and the sacrifice layer is etched by using the resist mask. An electrode material is further deposited in this state, and the resist mask is lifted off, and the contact electrode is formed. According to a fifth embodiment of the present invention, there is provided a method of fabricating a vertical resonator type surface light emitting semiconductor laser device, wherein a protective film is formed after forming a second conductivity type semiconductor multi-layered film reflection mirror and before shaping the semiconductor multi-layered film reflection mirror and forming a contact electrode.

Hereinafter, a vertical resonator type surface light emitting laser device and a fabrication method thereof according to the present invention will be described.

Vertical Resonator Type Surface Light Emitting Semiconductor Laser Device

A vertical resonator type surface semiconductor laser device according to a first embodiment of the present invention will be described hereinafter.

The vertical resonator type surface light emitting semiconductor laser device according to the first embodiment comprises, on a surface of a semiconductor substrate, a basic structure, that is, a vertical resonator section in which there are sequentially provided at least: a first semiconductor multi-layered film reflection mirror; an active layer; a second semiconductor multi-layered film reflection mirror; and, if necessary, a contact layer. Further, on the second semiconductor multi-layered reflection mirror or on contact layer there is provided: a structure such as a contact electrode having a laser emitting port (opening); a protective film covering the laser emitting port; and insulating film; a wiring electrode; or the like.

It is not necessary to provide the contact layer in the case where the second semiconductor multi-layered film reflection mirror functions as a contact layer. Conversely, in the case where the mirror does not function as a contact layer, the reflection mirror is preferably provided in order to lower the contact resistance.

Figure 7A:
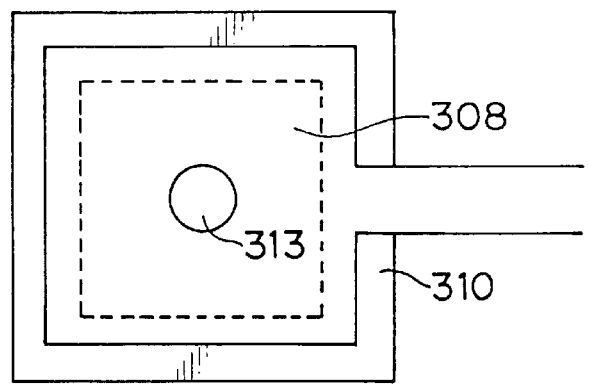
FIGS. 7A and 7B are top and sectional views showing a conventional vertical resonator type surface light emitting semiconductor laser device.
Figure 7B:
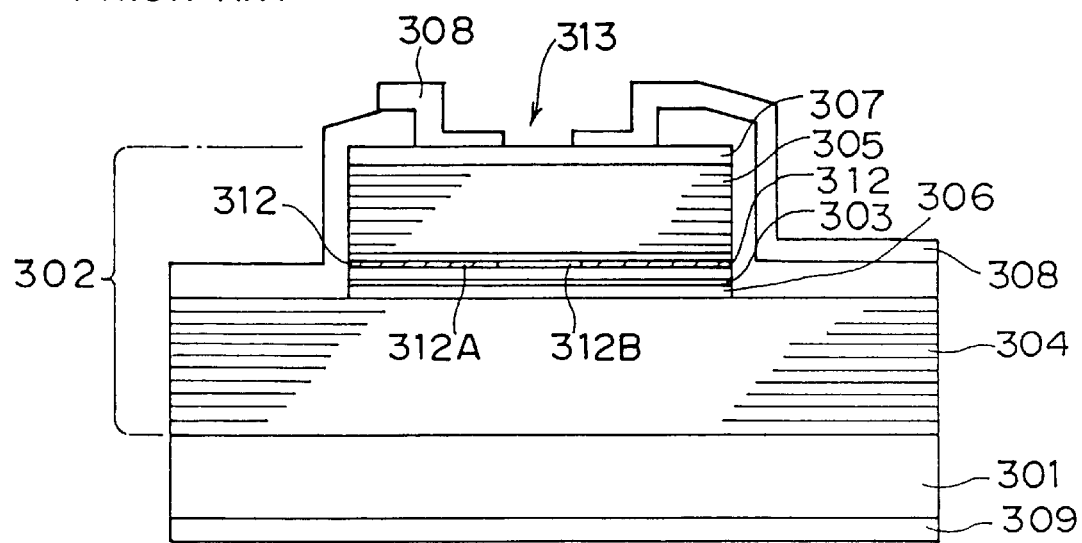

The vertical resonator section may be such that at least a reflection mirror (lower reflection mirror) 304 formed by a first semiconductor multi-layered film; a spacer layer 306; an active layer 303; an AlAs layer 312; a reflection mirror (upper reflection mirror) 305 formed by a second semiconductor multi-layered film; and a contact layer 307 are laminated sequentially on a surface on which the lower electrode of a semiconductor substrate 301 having a lower electrode 309 is not provided. FIGS. 7A and 7B are views showing an example of a conventional vertical resonator type surface light emitting semiconductor laser device. This also applies to a vertical resonator type surface light emitting semiconductor laser device according to the second embodiment described later.

Here, in the present invention, immediately after a contact electrode having an opening has been formed on a second semiconductor multi-layered reflection mirror or contact layer, i.e., before another structure finally arranged on a contact electrode is formed (at the initial stage of process), a protective film is provided so as to cover the entirety of the opening. The protective film is preferably provided as the lowest layer on the second semiconductor multi-layered reflection mirror or contact layer.

The contact electrode to be bonded with the second semiconductor multi-layered film reflection mirror or contact layer is connected to a wiring electrode formed via an insulating film so as to be connected to the second semiconductor multi-layered film reflection mirror or contact layer. However, if the contact electrode is to be formed integrally with a wiring electrode, it is necessary to form a structure such as electrode before protecting the second semiconductor multi-layered film reflection mirror or contact layer. Thus, the damage of the contact layer cannot be avoided. Therefore, immediately after the contact layer has been formed, a contact electrode is formed independent of the step of forming the wiring electrode, and the contact electrode functions as an electrode and a protective layer.

In addition, the contact electrode has an opening for emitting laser light, and is provided on the second semiconductor multi-layered reflection mirror or contact layer. Thus, in an opening region in which the contact electrode is not formed, the second semiconductor multi-layered reflection mirror or contact layer is exposed, and is easily damaged such as eroded or eliminated in the process after the layer has been formed. Therefore, a protective film is provided in the opening region during the device fabrication process, and the contact layer produced in the fabrication process after the contact layer has been formed is prevented from being damaged. Moreover, a patterned protective film is employed on the protective film, making it possible to form a protective film at the initial stage of the entire fabrication process, without any trouble. A specific fabrication method will be described later.

This applies as well to the vertical resonator type surface light emitting semiconductor laser device according to the second embodiment of the present invention, which will be described later.

Figure 1B:
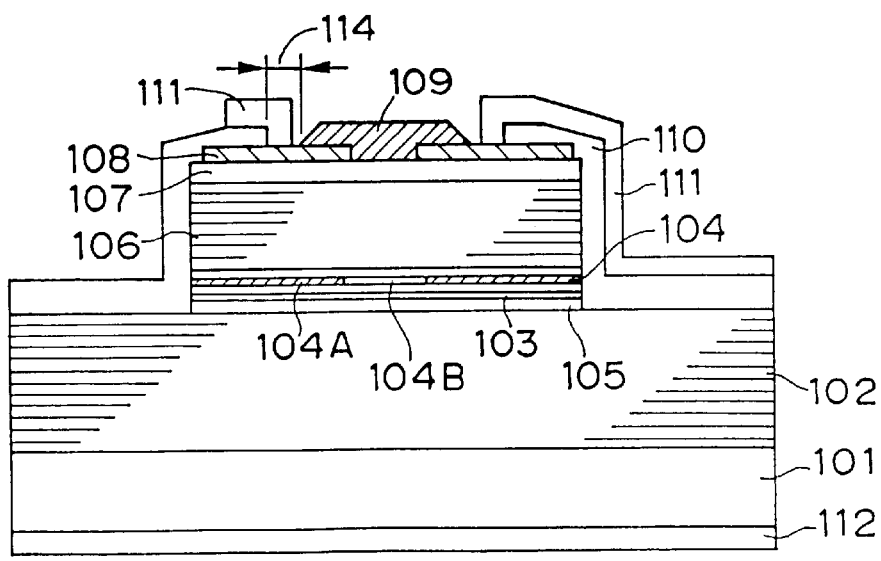

With regard to the positional relationship between the protective film and the second semiconductor multi-layered film reflection mirror or contact electrode, any embodiment in which an opening is not fully exposed may suffice. The device may be formed such that the protective film has the same diameter as the opening so as to close only the opening of the contact electrode, or may be formed such that the protective film covers the entire opening by providing a portion larger than the opening in diameter. For example, the device may be provided according to the embodiment as shown in FIGS. 1A and 1B. FIGS. 1A and 1B are structural views showing an example of the a vertical resonator type surface light emitting semiconductor laser device according to the present embodiment of the present invention.

The vertical resonator type surface light emitting semiconductor laser device shown in FIGS. 1A and 1B is structured as follows. That is, on a surface on which the lower electrode of a semiconductor substrate having a lower electrode 112 is not provided, there are sequentially at least laminated: at least a first conductivity type semiconductor multi-layered film reflection mirror 102; an active layer 103 via a spacer layer 105 provided on the reflection mirror 102; a second conductivity type semiconductor multi-layered film reflection mirror 106 via an AlAs layer 104 provided on the active layer; and a contact layer 107, so as to form a resonator portion. A contact electrode 108 having an opening 113 is formed on the contact layer 107. A protective layer 109 is provided so as to cover the entirety of this opening 113.

Further, in a region in which the protective layer 109 on the contact electrode 108 is not formed, an insulating film 110 is provided so as to have a contact hole 114, a contact electrode 108 is connected in the contact hole 114, and a wiring electrode 111 is formed on the insulating film 110. In the present invention, although an embodiment in which the contact layer is not exposed is preferred, a contact electrode is preferably formed in a region in which the protective film and/or the insulating film is not formed on the contact layer.

Figure 2A:
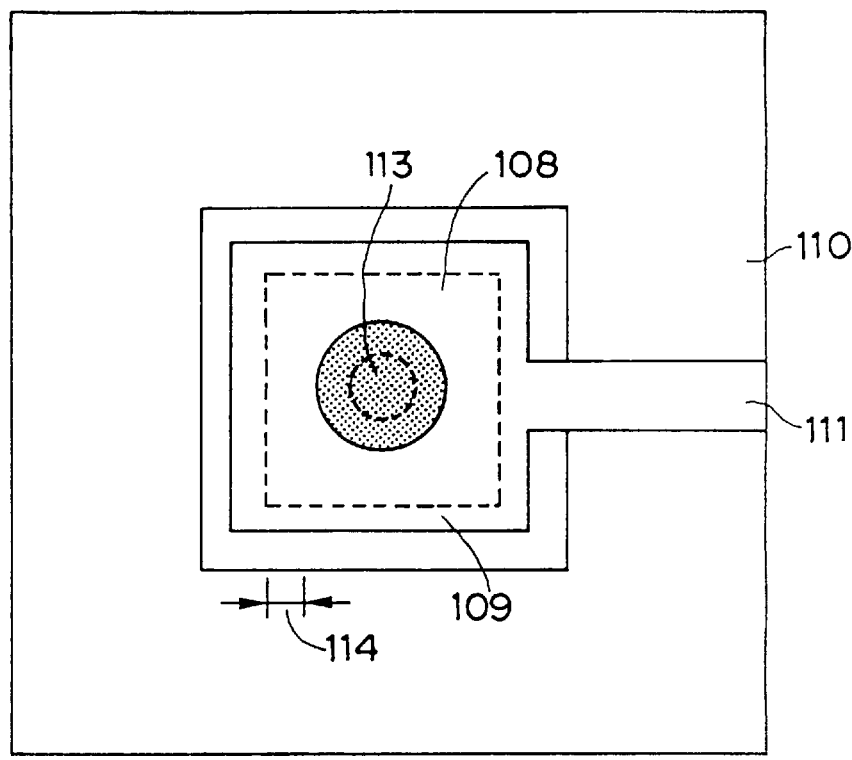
FIGS. 2A and 2B are top and sectional views showing another example of the vertical resonator type surface light emitting semiconductor laser device according to the first aspect of the present invention.
Figure 2B:
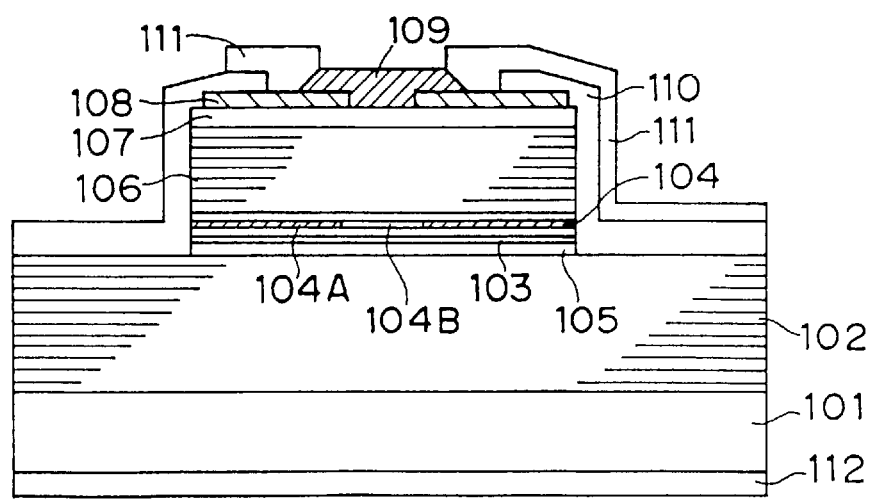

In addition, as shown in FIGS. 2A and 2B, the vertical resonator type surface light emitting semiconductor laser device according to the first embodiment of the present invention may be bonded with a contact electrode exposed in a contact hole in which both of the protective film 109 and insulating film 110 are not formed, and a wiring electrode 111 may be arranged so as to be superimposed on the protective film (surface).

As the film thickness of the protective film, it is preferable to provide a film thickness in a range in which the reflectance, of a reflection body that includes the second conductivity type semiconductor multi-layered film reflection mirror 106, the contact layer 107, and the protective film 109 that are positioned on the upper layer of the active layer 103, with respect to the emitted light of a laser wavelength is substantially extremely large. That is, a film thickness in which reflectance can be maintained high is preferable. The film thickness denotes the distance between an interface in contact with the contact layer and a surface (surface of the protective film in a region in which an exposure face is substantially flat) of the protective film opposite to the interface. This distance is affected by the thickness of the contact electrode or reflectance of light of the reflection body. Specifically, the distance is obtained by the formula below.

$$d=(\lambda/2)\cdot(N/n)$$

where d denotes the film thickness of the protective film (microns); λ denotes the laser light wavelength (nm); N denotes a natural number of 1 or more; and n denotes the refractive index of the protective film. If the film thickness of the protective film is outside the above value, the light reflectance of the reflection body is lowered, resulting in an increased threshold current value.

The protective film is desirably made of a transparent medium that transmits laser light, which medium is selected from $SiO_2$ film, $SiO_xN_y$ film, $SiN_x$ film, and $In_xSn_yO_z$ film (ITO film). The protective film forming method can be selected conveniently and is not particularly limited.

The contact layer is made of trimethyl gallium (TMG) and arsine ($AsH_3$). For example, by a method such as a method for growing an organic metal gas phase, this contact layer can be formed together with the lower DBR layer (the first semiconductor multi-layered film reflection mirror), the active layer, the spacer layer, and the upper DBR layer (the second semiconductor multi-layered reflection mirror) that form the main portion. The film thickness of the contact layer is generally 0.005 to 0.05 microns in the case of a VCSEL with a short wavelength bandwidth having output wavelength in the short wavelength region of 780 nm.

The semiconductor substrate may be conductive or nonconductive, and a substrate made of gallium arsenic, indium phosphide or the like can be selected appropriately according to the type of active layer. In actuality, the substrate is substantially determined uniquely depending on the target laser light emission wavelength. For example, in the case of a wavelength of 480 to 980, a GaAs substrate is selected, and in the case of a wavelength of 1100 to 1550 nm, an InP substrate is selected.

Although a lower electrode 112 is provided on one surface of this semiconductor substrate, the lower electrode 112 functions as an electrical contact when photons are generated. At this time, the semiconductor substrate forms a part of a current path. That is, the first semiconductor multi-layered film reflection mirror 102 is electrically connected to the electrical contact via the semiconductor substrate. The semiconductor multi-layered film reflection mirror 102 may be connected to a power source in another embodiment.

The lower electrode can be generally formed by a well known method in which a conductive metal is formed by sputtering or vapor deposition, and then, is annealed.

The first and second semiconductor multi-layered film reflection mirrors 102 and 106 are each a dispersed brag reflection mirror (DBR) having a plurality of alternating layers laminated thereon. Each of the alternating layers is a material layer having an alternately different refractive index. The mirrors reflects photons produced by the active layer 103, increases the light density in the active layer, induces laser oscillation, and serves to emit a specific wavelength light selected by a spacer layer from an opening of the contact electrode. The alternating layers can be fabricated by employing arbitrary, appropriate materials such as aluminum—gallium—arsenic (AlGaAs) with different aluminum and gallium densities (i.e., contents) or indium phosphite—aluminum—gallium (InAlGaP) with different aluminum and gallium densities (i.e., contents).

In addition, the first and second semiconductor multi-layered film reflection mirrors are typically doped with an arbitrary and appropriate n-type dopant and p-type dopant. In general, n-type dopants such as seren (Se) or silicon (Si) and p-type dopants such as carbon (C), zinc (Zn), beryllium (Be) can be used.

The plurality of alternating layers can be structured together in an arbitrary number of alternating pairs. That is, in the second semiconductor multi-layered film reflection mirror 102, for example, a first layer and a second layer may be alternately paired from the semiconductor substrate (this applies to the first semiconductor multi-layered film reflection mirror 102 as well). The alternating pairs may be arbitrarily laminated. The range of the number of alternating pairs is generally 20 to 60 pairs, and 25 to 55 pairs are preferable, and the nominal number is 30 to 45 pairs.

The active layer 103 is structured so that a quantum well layer is provided between two barrier layers. The quantum well layer and barrier layer can be fabricated from materials such as gallium arsenic, aluminum—gallium—arsenic, indium phosphite gallium, indium phosphite—aluminum—gallium, indium—gallium arsenic, indium phosphite—gallium. In the quantum well layer and barrier layer, the quantum well width or the like can be designed and fabricated according to a desired wavelength to be oscillated. The width is preferably 50 to 150 angstroms, and is more preferably 75 to 125 angstroms. The nominal value is 100 angstroms.

As described above, after the second conductivity type semiconductor multi-layered reflection mirror or contact layer has been formed, a contact electrode having an opening is first formed, and then, an electrode opening that is laser emitting port is covered with a protective film immediately thereafter. In the subsequent process, in a vertical resonator type surface light emitting semiconductor laser (VCSEL) fabricated by carried out a process without removing the protective film, a contact electrode can be reliably formed in a contact layer made of thin GaAs. Thus, the low-resistance and stable I-V characteristics of the device can be obtained. In addition, the laser emitting port is not exposed to plasmas or chemicals during the process. Thus, the GaAs at the top surface layer part of the contact layer is etched, and the AlGaAs or the like is not exposed. As a result, a high laser output can be achieved. Moreover, when the fabricated device is left exposed to air or a current is injected, a blackening phenomenon in which the laser emitting port is oxidized and blackened does not occur. In addition, lowering of laser output over time can be avoided, and the device reliability can be improved.

Next, the vertical resonator type surface light emitting laser device according to the second embodiment of the present invention will be described.

The vertical resonator type surface semiconductor laser device according to the second embodiment comprises, on a surface of a semiconductor substrate, a basic structure, that is, a vertical resonator section in which at least the following are layered in order: first semiconductor multi-layered film reflection mirror, an active layer, a second semiconductor multi-layered film reflection mirror, and, if necessary, a contact layer. Further, the device comprises a structure of a protective layer; a contact electrode provided on the second semiconductor multi-layered film reflection mirror or contact layer, the contact electrode provided so as to be superimposed on the surface of the protective film and having a laser emitting port (opening); an insulating film, a wiring electrode or the like.

As in the vertical resonator type surface light emitting semiconductor laser device according to the first embodiment, it is not necessary to provide the contact layer in the case where the second semiconductor multi-layered film reflection mirror functions as a contact layer. Conversely, in the case where the mirror does not function as a contact layer, a contact layer is preferably provided in that laser output is improved. As has been already described, the vertical resonator section may be structured as shown in FIGS. 7A and 7B, for example.

In the present embodiment, the protective film is formed as a topmost structure (first structure) in a plurality of structures finally structured on the second semiconductor multi-layered film reflection mirror or on the contact layer. That is, in order to keep damage of at least laser emitting port (opening) to a minimum, a protective film is formed before any structure is provided on the second semiconductor multi-layered film reflection mirror or contact layer.

Therefore, as in the vertical resonator type surface light emitting semiconductor laser device according to the first embodiment, effects on the second semiconductor multi-layered film reflection mirror or contact layer can be avoided not only in the case where the contact electrode is formed integrally with the wiring electrode, but also during the process of forming the contact electrode, and laser output can be improved more stably. A specific fabrication method will be described later.

In the present embodiment, in the case where the wiring electrode is formed in direct contact with the surface of the second semiconductor multi-layered film reflection mirror or contact layer, the contact layer does not have to be provided independent of the wiring electrode (FIGS. 15A and 15B and FIGS. 17A and 17B). Even if a contact electrode is not provided, it suffices as long as the region in which the protective layer is not provided is not damaged, and the wiring electrode can be provided so as to be serve as the contact electrode. In this manner, the device structure and fabrication process can be simplified. A specific fabrication method will be described later.

With regard to the positional relationship between the protective layer and the second semiconductor multi-layered film reflection mirror or contact electrode, the protective film may be positioned in contact with the surface of the second semiconductor multi-layered film reflection mirror or contact electrode so as to cover the laser emitting port. For example, the device may be provided as per embodiment shown in FIGS. 10A and 10B. FIG. 17 is a structural view showing an example of a vertical resonator type surface light emitting semiconductor laser device according to the second embodiment of the present invention.

Figure 10A:
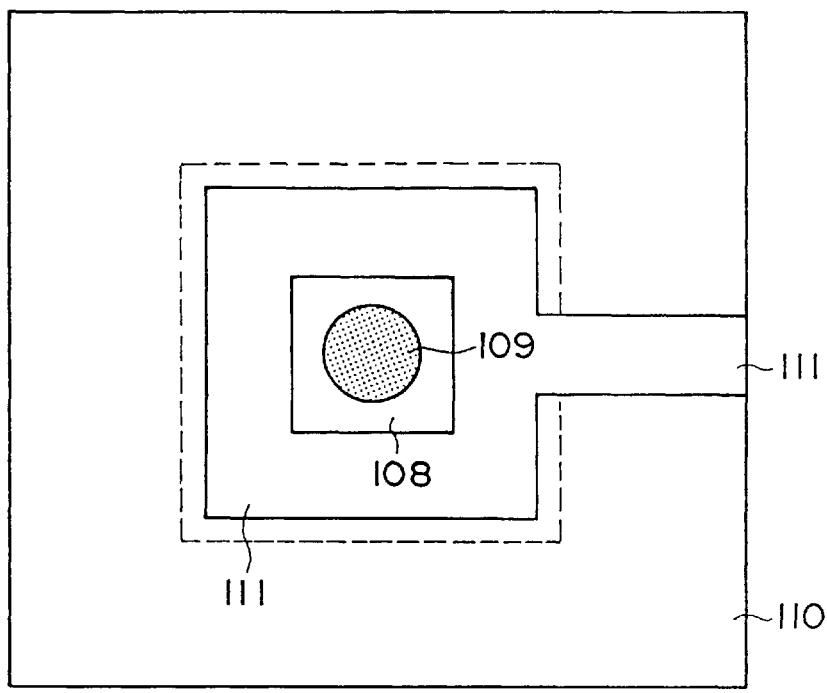
FIGS. 10A and 10B are views showing an example of a vertical resonator type surface light emitting semiconductor laser device according to a second aspect of the present invention.
Figure 10B:
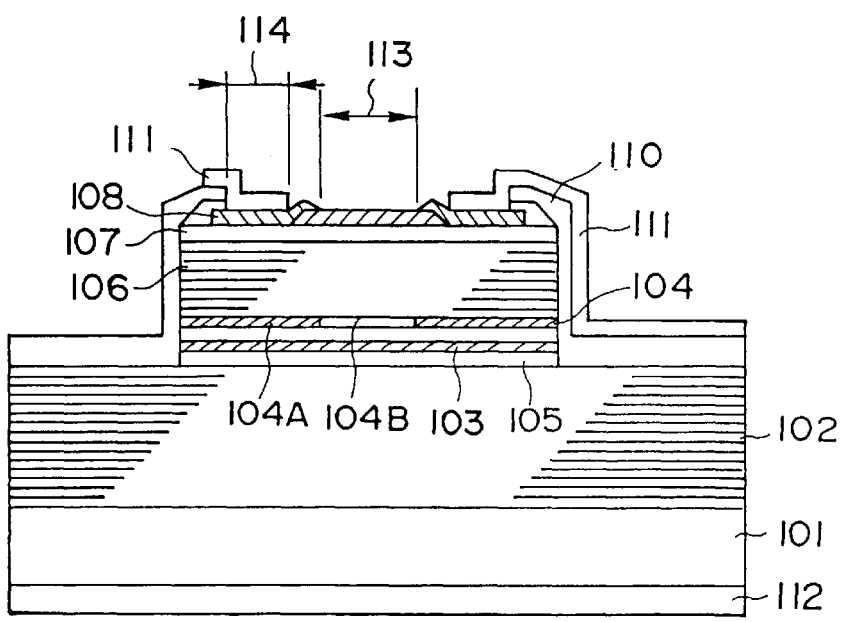

The vertical resonator type surface light emitting semiconductor laser device shown in FIGS. 10A and 10B is structured as follows. That is, as in the first embodiment, a resonator section is formed; a protective film 109 is formed on a contact layer 107; and a contact electrode 108 is provided so as to form an opening (laser emitting port) 113 on a protective layer only to be superimposed on the surface of the protective film 109.

In a region that is substantially flat on the contact electrode 108 (i.e., at the contact hole 114), a wiring electrode 111 connected to the contact electrode 108 by interposing the insulating film 110 is formed. As in the vertical resonator type surface light emitting semiconductor laser device according to the first embodiment, an embodiment in which the contact layer is not exposed is preferable. The contact electrode is preferably formed in a region in which the protective film and/or insulation layer is not formed on the contact layer.

The shape of the surface of the protective layer is not limited in particular, and can be selected as required. For example, as shown in FIGS. 10A and 10B, the shape may have a substantially flat region and an inclined region at the peripheral rim of the region.

In the present invention, the substantially flat region of the protective film is denotes a surface (exposed face) opposite to a side in contact with (opposite to) the second conductivity type semiconductor multi-layered film reflection mirror or contact layer in a state in which the region is formed on the second conductivity type semiconductor multi-layered film reflection mirror or contact layer. The surface is substantially parallel to the second conductivity type semiconductor multi-layered film reflection mirror or contact layer.

Figure 14A:
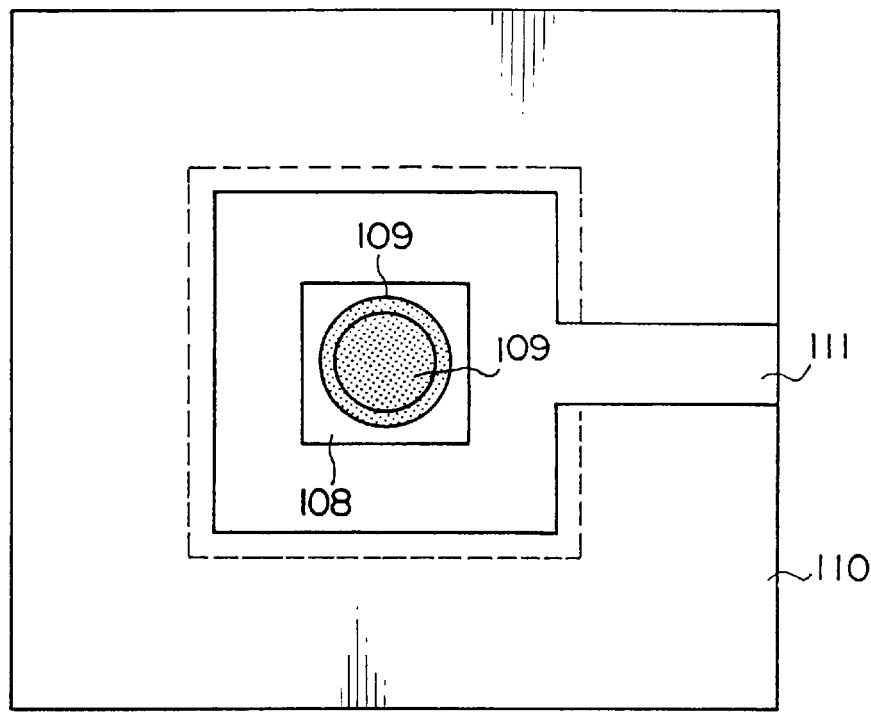
FIGS. 14A and 14B are top and side sectional views showing an example of the vertical resonator type surface light emitting semiconductor laser device according to the second aspect of the present invention.
Figure 14B:
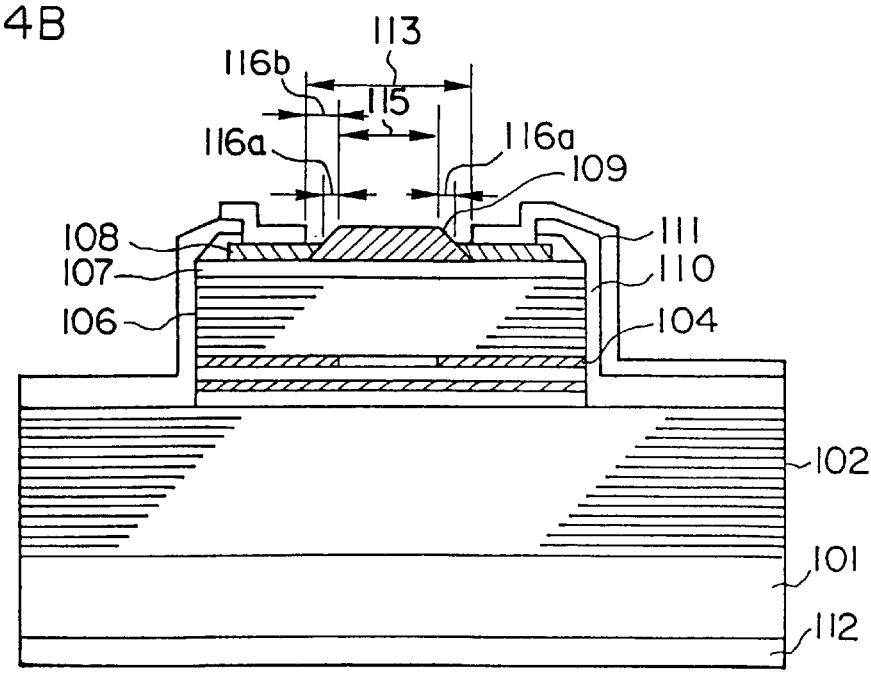

As has been already described, the opening is formed on the protective layer only. With regard to the positional relationship between the substantially flat region with respect to the opening and the inclined region, only the substantially flat region may be included in a region in which the opening is exposed, or both of the substantially flat region and the inclined region may be included. In any case, as in the first embodiment, the layer thickness of the protective layer is preferably defined in a region in which light reflectance is extremely large in the substantially flat region. For example, as shown in FIGS. 14A and 14B, in the latter case, in a reflection body including the second conductivity type semiconductor multi-layered film reflection mirror, contact layer, and protective film, the reflectance increases as the film thickness of the protective film is thicker in the inclined region (tapered region) 114, and the reflectance is maximal (i.e., extremely large) in the substantially flat region 113. In this case, a wave guide in the transverse direction of laser can be narrowed more significantly than an opening formed by employing a contact electrode, and the taper angle and shape of the taper region are controlled as required, whereby a desired beam diameter or oscillation mode can be selected.

The film thickness and material of the protective layer, the material or layer thickness of the contact layer, the details about the lower electrode free of the semiconductor substrate or protective film, the first and second semiconductor multi-layered reflection mirror, active layer or the like, and preferred embodiments thereof are similar to those of the vertical resonator type surface light emitting semiconductor laser device according to the first embodiment.

As has been described above, a vertical resonator type surface light emitting laser device (VCSEL) is provided in which, after the second conductivity type semiconductor multi-layered film reflection mirror or contact layer has been formed, a protective film covering a region that is a laser emitting port is first formed, a contact electrode having an electrode opening that is a laser emitting port is provided on the protective layer, and the subsequent process is carried out without removing the protective layer The second conductivity type semiconductor multi-layered film reflection mirror or contact layer can be reliably protected at the laser emitting port, and thus, low-resistance and stable I-V characteristics can be achieved. In addition, the laser emitting port is not exposed to plasmas or chemicals during the process, and thus, the GaAs is etched at the top surface part of the contact layer, and the AlGaAs or the like is not exposed. As a result, a high laser output can be achieved. Moreover, there does not occur a blackening phenomenon in which, when a fabricated device is left exposed to air or a current is injected, the laser emitting port is oxidized and blackened. Thus, a lowering of laser output over time can be avoided, and device reliability can be improved.

Method of Fabricating Vertical Resonator Type Surface Light Emitting Semiconductor Laser Device As in the method of fabricating the vertical resonator type surface light emitting semiconductor laser device according to the first and second embodiments, a vertical resonator type surface light emitting semiconductor laser device according to the present invention can be fabricated as follows.

The fabrication methods according to the third and fourth embodiments comprise the steps of sequentially forming a first semiconductor multi-layered film reflection mirror, an active layer, a second semiconductor multi-layered reflection mirror, and a contact electrode with an opening on a semiconductor substrate; and further forming a protective film fully covering at least an opening immediately after the contact electrode has been formed, whereby the vertical resonator type surface light emitting semiconductor laser device of the above-described first embodiment is fabricated.

The fabrication method according to the fifth embodiment comprises the step of sequentially forming first semiconductor multi-layered film reflection mirrors, an active layer, a second semiconductor multi-layered film reflection mirror, a protective film, and a contact electrode having an opening on the semiconductor substrate, whereby the vertical resonator type surface light emitting semiconductor laser device in the above-described second embodiment is fabricated.

First, a plurality of alternating layers with their different refractive indices are laminated on a conductive semiconductor substrate to form a first conductivity type semiconductor multi-layered reflection mirror, and an active layer capable of discharging photons is laminated on the reflection mirror. Further, a plurality of alternating layers with their different refractive indices are laminated, to form a second conductivity type semiconductor multi-layered film reflection mirror. Thereafter, a conductive contact layer is laminated if needed, to fabricate the vertical resonator section.

This vertical resonator section may have a sectional structure similar to a resonator 302 as in FIGS. 7A and 7B, for example. In this case, a conductive semiconductor substrate 301 is provided. On the surface on one side of the semiconductor substrate, using a organic metal gas phase growing approach, there are sequentially laminated a lower reflection mirror (first reflection mirror) 304 having a plurality of alternating layers with different refractive indices; an active layer 303 via a spacer layer 306; an upper reflection mirror (second reflection mirror) 305 having a plurality of alternating layers with different refractive indices via an AlAs layer 312; and a contact layer 307.

Thereafter, in the method of fabricating the vertical resonator type surface emitting semiconductor laser device according to the third and fourth embodiments, there are formed: (i) a contact electrode, having an opening, on the second semiconductor multi-layered film reflection mirror or contact layer; or before forming a contact electrode, (ii) a sacrifice layer for preventing a contact layer from being damaged during resist developing. However, in either of the above cases (i) and (ii), a contact electrode is formed as a bottom layer on the contact layer, and a wiring electrode connected to the contact electrode is formed to be bonded with the contact electrode after the contact electrode has been formed.

On the other hand, in the method of fabricating the vertical resonator type surface light emitting laser device according to the fifth embodiment, there are formed (iii) a protective film on the second conductivity type semiconductor multi-layered film reflection mirror or contact layer; or (iv) a laminate section having a protective film forming layer for forming a protective layer and a coat film (etching mask) that can be etched for the protective film laminated sequentially. In either of the above cases (iii) and (iv), the protective film forming layer for forming the protective film is formed with highest priority before shaping the second conductivity type semiconductor multi-layered film reflection mirror and forming the contact electrode. The protective layer forming layer denotes a layer which is in a state in which a desired shape of the so-called protective film is not patterned.

In the case of the above (i), after a contact layer has been formed, a contact electrode having an opening is formed on the layer. Immediately after formation, at least the opening is fully covered with a protective film, and damage to the contact layer in the subsequent process is avoided. After the protective film has been formed, in order to ensure insulation properties between the contact layer and the semiconductor multi-layered film reflection mirror or the like, an exposure section (contact hole) is provided on the contact electrode and in a region in which the protective film is not formed, whereby an insulating film is formed. Then, a wiring electrode is formed on the insulating film in this contact hole and is bonded with the contact electrode. In this case, the step after formation of the protective layer (such as formation of the insulating film or wiring electrode or the like) is carried out without the protective layer being fully removed.

In the case of above (ii), a film made of an SiO film or the like is film deposited in advance as a sacrifice layer on a contact layer such that the resist developing liquid does not contact the contact layer made of GaAs and etch the GaAs itself; a resist is applied onto the sacrifice layer; and the resist is patterned by performing photolithography.

By doing this, the process can be carried out without causing the developing liquid to directly contact the GaAs that is a lower layer of the sacrifice later. In addition, after the resist has been patterned, the sacrifice layer exposed to the opening of the resist pattern is etched and removed, and a contact layer is exposed. Then, the metal, of which the contact electrode is made, is film deposited over the resist. Then, the resist and the metal film deposited thereon are lifted off, and the contact electrode is patterned. The sacrifice layer that remains on the contact layer may be removed or may be left if no problem occurs.

In the present invention, in either case of the above (i) and (ii), a vertical resonator type surface light emitting semiconductor laser device having high reliability can be fabricated. However, from of the viewpoint of preventing a contact layer from being damaged due to the developing liquid during resist developing, and stabilizing laser output, it is more preferable to use the method of the above (ii), that is, a method of forming a sacrifice layer before forming a contact electrode, and then, forming the contact electrode.

From the foregoing, in the process of forming the contact electrode, there can be avoided a change in film thickness of a contact layer due to damage such as erosion or elimination of the contact layer in a region in which the contact electrode is to be formed; and low resistance characteristics free of dispersion are achieved; and laser light with a constant output can be produced by applying a low voltage and achieving a high output that does not decrease.

Using the method of (ii), after a contact electrode has been formed by patterning, as in the case of (i), at least an opening is fully covered with a protective film, a contact layer at the opening is protected, and an insulating film having an exposure section (contact hole) is formed in a region in which a protective film is not formed on the contact electrode. Then, a wiring electrode is formed on the insulating film so as to be bonded with the contact electrode in this contact hole.

Preferable examples of the material used for the sacrifice layer formed in the above (ii) are a SiON film, a $SiN_x$ film, a $SiO_z$ film, an $In_xSn_yO_z$ film, SOG film or the like. The $In_xSn_yO_z$ film is preferable in that the film can be selectively etched for a contact layer made of GaAs by employing a dilution hydrochloric acid.

Although the sacrifice layer can be preferably formed a known physical film deposition method such as sputtering or the CVD method, the sputtering method is particularly preferable in that transformation of a contact layer made of GaAs can be avoided.

In the case where a SOG film is employed as a sacrifice layer, an annealing treatment is carried out in order to cure, or harden the film at 250° C. or less, whereby the film can be simply formed.

That is, when the SOG film is employed, the film can be formed by applying a coat and subjecting it to annealing treatment at 300 to 400° C. Therefore, this employment is preferable in that even slight plasma damage that enters in the contact layer during film deposition, can be avoided by using the sputtering method. Moreover, SOG can be cured at 250° C. or less. Thus, there can be expected an effect of lowered contact resistance because the oxidization of the contact layer surface can be restricted.

The layer thickness of the sacrifice layer is preferably 0.05 to 0.3 micron. If the layer thickness is less than 0.05 microns, an increased number of pin holes is produced, and the performance of the sacrifice layer is significantly lowered. On the other hand, if the thickness exceeds 0.3 micron, side etching of the sacrifice layer in the subsequent step is considerable, which may cause the resist to collapse. Further, in consideration of a case in which the sacrifice layer remains, it is preferable that the film thickness is within the above range, and that the total reflectance of the semiconductor multi-layered film reflection mirror and the sacrifice layer is maintained high.

As described above, a contact electrode is formed after the sacrifice layer has been formed in advance, whereby the etching or elimination of the contact layer can be prevented without the contact layer made of GaAs coming into contact with the resist developing liquid. Moreover, the AlGaAs layer that is the lower layer is not exposed on the surface. Therefore, an electrode can be formed reliably on the contact layer having an initially defined film thickness. Thus, the low-resistance I-V characteristics of the fabricated device can be achieved, and stable device characteristics with less dispersion can be achieved.

In addition, the surface of the contact layer (GaAs layer) in the laser emitting port is not etched, and thus, the process durability on the surface is improved, and transformation of the laser emitting port during the process can be reduced to a minimum. As a result, the initial laser output characteristics of the device are improved; transformation of the emitting port when the port is left exposed to air or when a current is injected is reduced to a minimum; and the deterioration of laser output with an elapse of time can be reduced to the minimum. With respect to the emitting port, its effect can be enhanced more significantly by combining the sacrifice layer and the protective layer covering the emitting port (opening).

In the case of the above (iii), a protecting film forming layer is formed and etched, and a protective film is provided, thereby avoiding damage of the second conductivity type semiconductor film reflection mirror or contact layer in the subsequent process. Further, a contact electrode is formed on the second conductivity type semiconductor multi-layered film reflection mirror or contact layer so as to provide an opening coming into contact with the surface of the protective film and having the protective film exposed thereto. In order to ensure insulation properties between the contact layer and the semiconductor multi-layered film reflection mirror or the like, an insulating film having an exposure section (contact hole) is formed on the contact electrode in a region in which the protective film is not formed. Then, a wiring electrode is formed on the insulating film so as to be bonded with the contact electrode in this contact hole. In this case, in the step after the protective film has been formed, the insulating film and wiring electrode or the like are, formed without the protective film being fully removed.

In the case of the above (iv), on the second conductivity type semiconductor multi-layered reflection mirror or contact layer, there are sequentially formed a laminate section between the protective film forming layer for forming a protective layer and a coat film (etching mask) that can be selectively etched for the protective film. The above laminate section is etched in a mask shaped pattern to be processed in a post structure. This laminate section is post processed as a mask, and the entire post is coated with an insulating film having an etching selectivity ratio different from the protective layer forming layer. Then, a resist is further formed. The resist is employed as a mask in etching the insulating film and the coat film, and a via for forming the contact hole is formed. Furthermore, a resist is formed to make a mask, and the protective film forming layer is etched to form a protective film and a contact hole having the second semiconductor multi-layered film reflection mirror and contact layer exposed thereto. Thereafter, a wiring electrode is formed in contact with the exposed second semiconductor multi-layered film reflection mirror and contact layer. Immediately after the second semiconductor multi-layered film reflection mirror and contact layer have been exposed, a wiring electrode is formed before the exposure section is damaged in the process. In this case, if a wiring electrode which serves as a contact electrode is formed, there is no need to form another contact electrode.

Figure 18A:
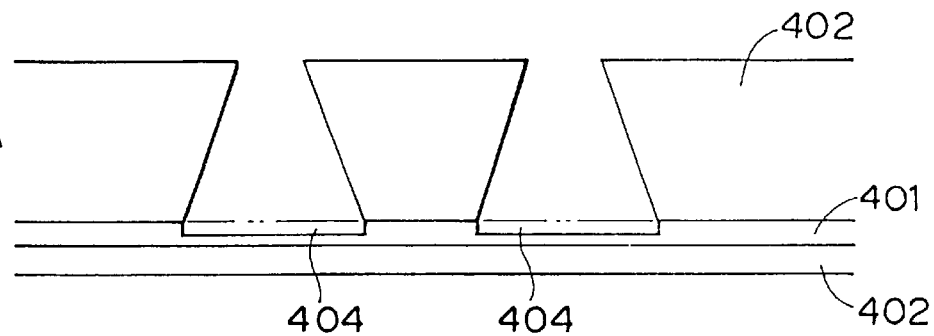
FIGS. 18A to 18C are schematic views showing how a contact layer in the VCSEL emitting port is deformed.
Figure 18B:
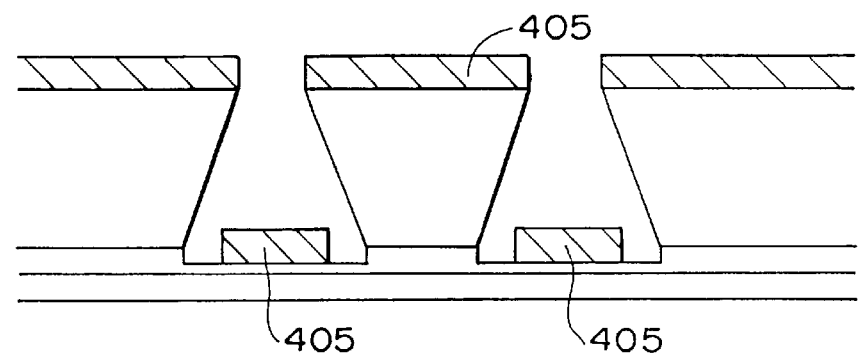
Figure 18C:
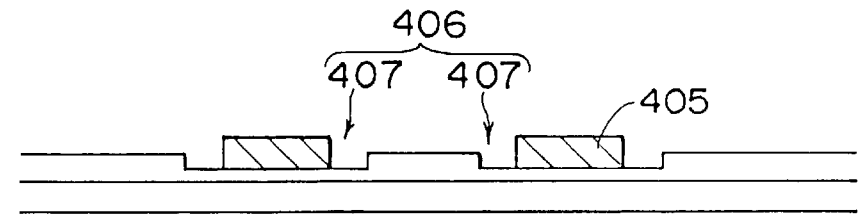

From the foregoing, as in the above (ii), in a process of forming a contact electrode, as shown in FIGS. 18A to 18C, there can be avoided a change in film thickness due to damage of the second semiconductor multi-layered film reflection mirror or contact layer in a region in which the contact electrode is to be formed. Low resistance characteristics free of dispersion are achieved, and laser light of a constant and high output can be produced by applying a low voltage without there being a decrease in output over time.

In the step after the protective film has been formed in the above (i) to (iv), as a coat film coated on the second semiconductor multi-layered film reflection mirror or contact layer having a protective film (that is, as a film provided as an etching mask or insulating film and the like), it is preferable to employ a material that can be selectively etched for the protective film, that is, a material with a different etching velocity than that of the material forming the protective layer. Specifically, examples of such a material include $SiO_2$, $SiO_xN_y$, $SiN_x$, $In_xSn_yO_z$ or the like.

Among them, it is preferable that either one of the protective film and the coat film be formed of $SiO_2$, $SiO_xN_y$, or $SiN_x$, and the other be formed of $In_xSn_yO_z$. In particular, it is preferable that the protective layer be formed of $SiO_2$, $SiO_xN_y$, or $SiN_x$, and that the coat layer be formed of $In_xSn_yO_x$.

Hereinafter, Examples of the present invention will be described. The present invention is not limited to these Examples.

EXAMPLE 1

A vertical resonator type surface light emitting semiconductor laser device (first embodiment of the present invention) having a structure similar to that shown in FIGS. 1A and 1B was fabricated.

On an Si doped ($N_d=1\times10^{18}$ cm$^{-3}$) n-type GaAs semiconductor substrate 101, there are formed and sequentially laminated: a 40.5 cycle Si doped ($N_d=1\times10^{18}$ cm$^{-3}$) n-type Al $_{0.3}$ Ga $_{0.7}$ As/Al $_{0.9}$ Ga $_{0.1}$ As distribution brag reflection mirror (DBR layer) 102; an undoped λ Al $_{0.6}$ Ga $_{0.4}$ As spacer layer 105; a triple quantum well Al $_{0.11}$ Ga $_{0.89}$ As/Al $_{0.3}$ Ga $_{0.7}$ As active layer 103; Zn doped (Na=7×10$^{17}$ cm$^{-3}$) p-type AlAs layer 104; 30.5 cycle Zn doped (Na=7×10$^{17}$ cm$^{-3}$) p-type Al $_{0.3}$ Ga $_{0.7}$ As/Al $_{0.9}$ Ga $_{0.1}$ As DBR layer 106; Zn doped (Na=1×10$^{19}$ cm$^{-3}$) p-type GaAs layer (contact layer) 107 (Si doped n-type GaAs buffer layer is not shown). The Zn doped (Na=7×10$^{17}$ cm$^{-3}$) p-type AlAs layer 104 is formed by an oxidized region 104A and a non-oxidized region 104B.

Further, a contact electrode 108 having an opening 113 is formed on the GaAs contact layer 107 in direct contact with the layer 107, and the opening 113 is fully covered with the SiON protective film 109. The diameter of the protective film 109 is formed to be greater than that of the opening 113 of the contact electrode 108.

In addition, on the contact electrode 108, an inter-layer insulating film 110 having a contact hole 114 is formed so as to cover a post structure; and a wiring electrode 111 is formed on the interlayer insulating film in contact with the contact electrode 108. Here, as in FIGS. 1A and 1B, in the case where there is provided a region in which the contact electrode 108 and the inter-layer insulating film 110 are superimposed with other, the contact electrode 108 is disposed as lying under the inter-layer insulating film 110. The wiring electrode 111 comes into contact with a region cut between the protective layer 109 and the inter-layer insulating film 110, i.e., on the surface between the protective film 109 and the contact electrode 108. That is, the contact electrode is positioned at the lowest layer in a structure that is formed on the contact layer.

In the contact hole 114, it is preferable that the surface of the contact layer 107 in that region be covered with the contact electrode 108, and the contact layer be not exposed.

Hereinafter, a specific method of fabricating an AlAs oxidized VCSEL according to the first embodiment of the present invention will be described by way of example with reference to FIGS. 3A to 3K.

(1) Fabricating a VCSEL Thin Film Substrate (Semiconductor Substrate)

First, a bulk crystal of III–V family compound semiconductor such as GaAs was employed as a substrate on which a III–V family compound (GaAs, AlGaAs) semiconductor thin film was epitaxially grown sequentially by using a metal organic vapor phase epitaxy (MOVPE) method, whereby a plurality of layers were formed to be laminated, and a first conductivity type semiconductor multi-layered film reflection mirror 203 are formed. On the semiconductor multi-layered film reflection mirror 203, as described previously, there are provided at least an active layer, a spacer, a second conductivity type semiconductor multi-layered film DBR reflection mirror, and a contact layer. Hereinafter, this substrate is referred to as "VCSEL thin film substrate". A specific description will be given below.

That is, on a Si doped ($N_d=1\times10^{18}$ cm$^{-3}$) n-type GaAs semiconductor substrate 201, there are laminated sequentially: an Si doped ($N_d=1\times10^{18}$ cm$^{-3}$) n-type GaAs buffer layer 202; a 40.5 cycle Si doped ($N_d=1\times10^{8}$ cm$^{-3}$) n-type Al $_{0.3}$ Ga $_{0.7}$ As/Al $_{0.9}$ Ga $_{0.1}$ As distribution brag reflection mirror (DBR layer) 203; an undoped λ Al $_{0.6}$ Ga $_{0.4}$ As spacer layer 208; a triple quantum well Al $_{0.11}$ Ga $_{0.89}$ As/Al $_{0.3}$ Ga $_{0.7}$ As active layer 204; a Zn doped (Na=7×10$^{17}$ cm$^{-3}$) p-type AlAs layer 205; 30.5 cycle Zn doped (Na=7×10$^{17}$ cm$^{-3}$) p-type Al $_{0.3}$ Ga $_{0.7}$ As/Al $_{0.9}$ Ga $_{0.1}$ As DBR layer 206; and a Zn doped (Na=1×10$^{19}$ cm$^{-3}$) p-type GaAs layer 207.

On the interface of each layer of the p-type Al $_{0.3}$ Ga $_{0.7}$ As/Al $_{0.9}$ Ga $_{0.1}$ As distribution brag reflection mirror (DBR layer), a band barrier buffer layer having a composition between Al $_{0.3}$ Ga $_{0.7}$ As and Al $_{0.9}$ Ga $_{0.1}$ As may be inserted in order to reduce a serial device resistance.

(2) Fabricating a p-type Contact Electrode Having an Opening

Figure 3A:
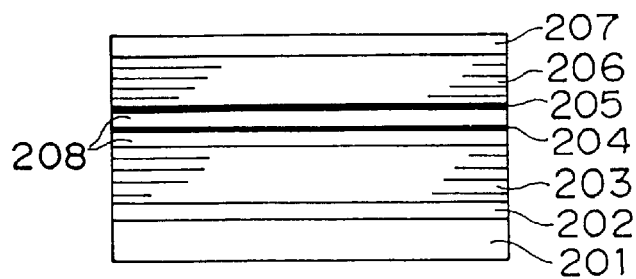
FIGS. 3A to 3K are illustrative views illustrating an example of the method of fabricating the vertical resonator type surface light emitting semiconductor laser device according to the first aspect of the present invention.
Figure 3B:
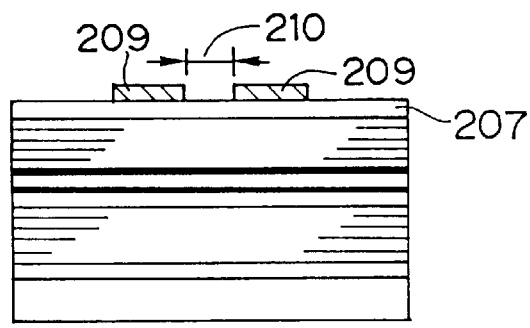

Next, as shown in FIG. 3B, a p-type contact electrode 209 having an opening 210 for laser emission is fabricated as follows on the surface of a contact layer 207 that is the outermost layer of the VCSEL thin film substrate fabricated by the MOVPE method. This p-type contact electrode can be preferably fabricated by using a lift-off method in which a resist pattern is formed on the surface of the contact layer 207 that is the outermost layer by means of general photolithography, Ti and Au are sequentially film deposited, and the resist is released to form an electrode; or by using a method in which Ti and Au are film deposited in advance, a resist pattern is formed on the Au film by means of general photolithography, and Ti and Au are etched and patterned. The p-type contact electrode may be made of AuZn/Au or Ti/Pt/Au or the like as well as Ti and Au.

(3) Forming a Protective Film Forming Layer

Figure 3C:
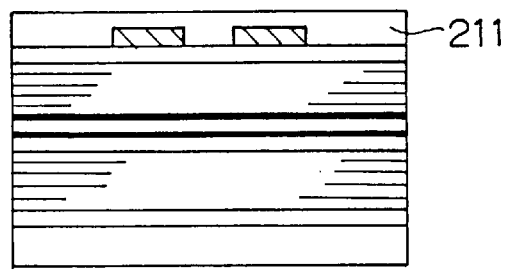

As shown in FIG. 3C, the contact electrode 209 is fabricated, and then, an insulating film made of SiON, SiN$_x$, and SiO$_2$ films is deposited on the entire surface of the VCSEL thin film substrate having a contact electrode 209 formed thereon by a CVD device or a sputtering device, and a protective film forming layer 211 is formed. The film thickness of the protective film must be thicker than the film thickness to be eliminated by etching, since the film is used as a mask for post etching.

(4) Film Depositing an n-type Back Face Electrode

Figure 3D:
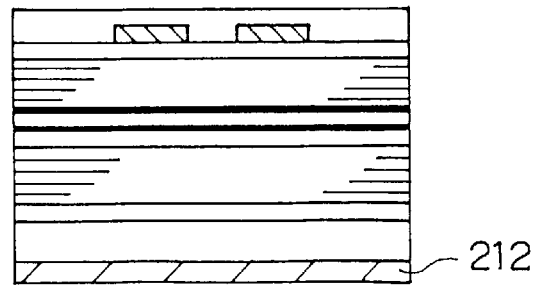

Here, as shown in FIG. 3D, an n-type electrode 212 is film deposited by a vapor deposition device on the surface of the VCSEL thin film substrate on which the contact electrode 209 is not provided. The n-type electrode is made of AuGe/Au or AuGe/Ni/Au.

In addition, annealing is carried out for several minutes to 30 minutes under the atmosphere of nitrogen at a temperature of 350 to 400° C. in order to produce both of the electrodes as low-resistance ohmic electrodes.

(5) Forming a Post Etching Mask

Figure 3E:
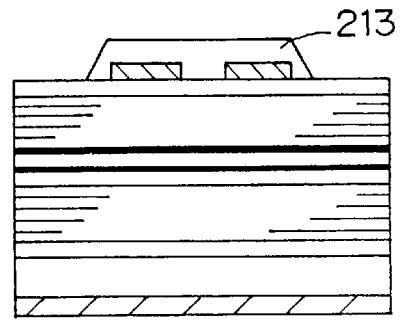
Figure 3F:
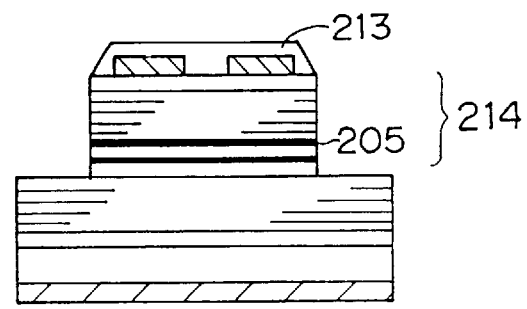

First, the VCSEL thin film substrate are etched at both ends. Then, the protective thin film forming layer 211 film deposited in the step of (3) are patterned in the shape as shown in FIG. 3E in order to provide a columnar post structure as shown in FIG. 3F, and an etching mask 213 are produced. Patterning are carried out by resist application, photolithography and etching. Etching can be carried out by a fluoric acid based etchant or dry etching or the like.

(6) Forming a Post Structure

Next, a portion other than the etching mask 213 is dry etched by means of a dry etching device employing a chlorine based gas up to the depth of several microns to some of tens of microns in which up to ends of the AlAs layer 205 are exposed, and a post structure 214 as shown in FIG. 3F is formed. At this time, a cross section of the laminate film of the VCSEL thin film substrate is exposed to the side face of the post.

(7) AlAs Oxidization Step

Figure 3G:
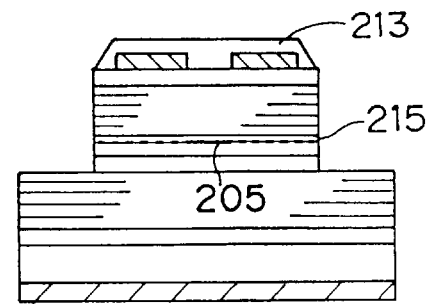

After the post structure has been fabricated, the structure is inserted into an annealing furnace, steam is introduced, and selective oxidization of the AlAs layer is carried out from the side face of the post (refer to FIG. 3G). At this time, the annealing temperature is set to about 350 to 400° C. In addition, the steam is introduced by bubbling hot water of 70 to 100° C. contained in a hot water tank with nitrogen carrier gas, and transporting it into the furnace. Although the AlGaAs and AlAs layers containing much Al are changed to Al oxides ($Al_xO_y$) by carrying out steam oxidization, the AlAs layer is overwhelmingly faster than the AlGaAs layer in oxidization velocity. Thus, only the AlAs layer is selectively oxidized from the wall end of the post to the center of the post, and an oxide layer 215 is formed. Then, by controlling the annealing time, the AlAs layer 205 can be left in a desired size at the center of the post.

The $Al_xO_y$ layer 215 has extremely low electric conductivity, and the AlAs layer 205 has high electric conductivity. Thus, a structure can be provided such that a current flows only the AlAs layer 205 that is left at the center of the post structure.

(8) Film Depositing an Inter-layer Insulating Film

Figure 3H:
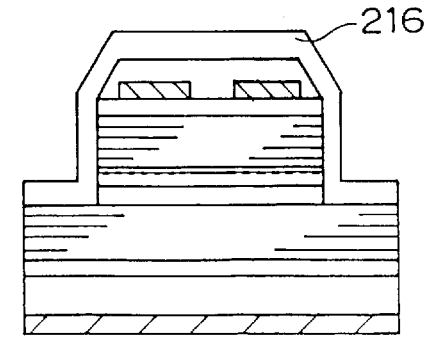

After AlAs oxidization has been carried out in the step of (7), as shown in FIG. 3H, the entire post is fully coated with an inter-layer insulating film 216 made of SiON. This coating is carried out in order to compensate for the lowasd strength of the post itself caused by substantially of the AlAs layer being substituted by a porous $Al_xO_y$ layer, and in order to prevent the transforming of the oxide layer by the porous $Al_xO_y$ film being placed in an exposed state at the end of the side wall of the post.

(9) Etching Back

Figure 3I:
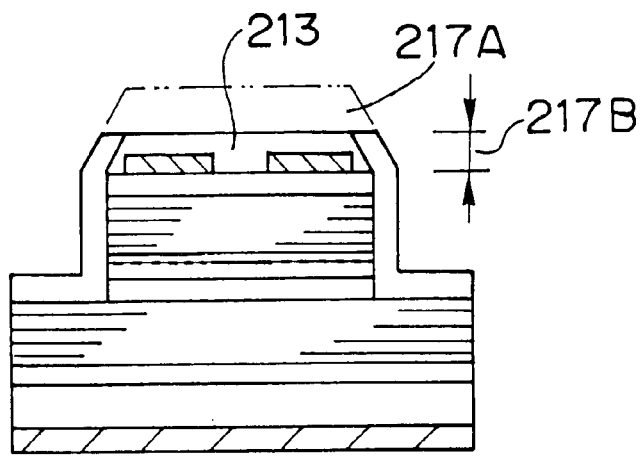
Figure 3J:
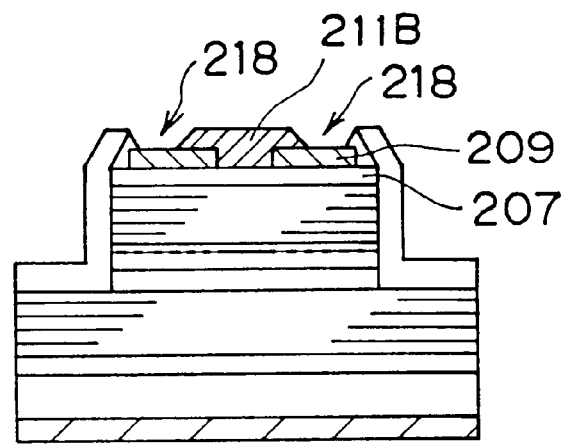

Then, as shown in FIG. 3I, etching back is carried out for a part (217A) of the inter-layer insulating film 216 and etching mask 213, thereby producing film thickness 217B of the etching mask 213 such that there can be highly maintained the reflectance of a reflection body that comprises the semiconductor multi-layered film reflection mirror 206, the contact layer 207, and the protective film 213 that exist in the lower layer (etching back step). In the case where desired film thickness is provided or in the case where it is unnecessary to increase the reflectance so much, the above etching back step may be eliminated.

(10) Fabricating a Contact Hole

Further by patterning and etching using photolithography, there is drilled a contact hole 218 that is present at the upper part of the post structure, the contact hole being adopted to ground a p-type wiring electrode on a contact electrode that exists in the lower layer of the protective film and inter-layer insulating film. Etching can be carried out by etching using chemicals such as buffered fluoric acid (BHF) or dry etching.

At this time, according to an embodiment in which a contact electrode 209 is formed on the entire surefface of the bottom of a contact hole 218, damage of the contact layer 207 in the further lower layer during the process can be avoided by the contact electrode.

(11) Forming a p-type Wiring Electrode

Figure 3K:
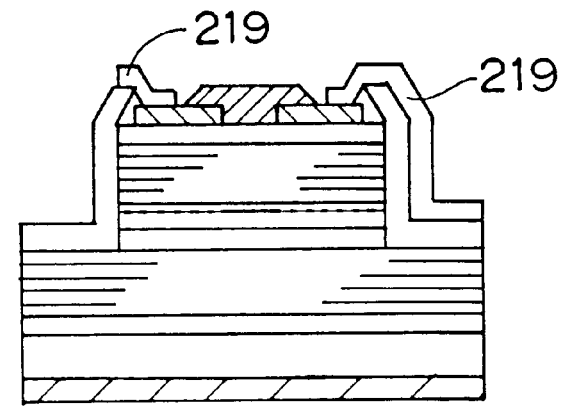

Last, a p-type wiring electrode 219 connected to a contact electrode is formed on an inter-layer insulating film 216, and a vertical resonator type surface light emitting semiconductor laser device according to the present invention, with the sectional structure shown in FIG. 3K, is fabricated.

The p-type wiring electrode 219 can be preferably formed by using the lift-off method in which a resist pattern is formed by general photolithography, Ti and Au are sequentially film deposited, and the resist is removed, or by using a method in which Ti and Au are film deposited in advance, a resist pattern is formed on an Au film by general photolithography, and Ti and Au are etched and patterned. The p-type electrode may be made of AuZn/Au, Ti/Pt/Au or the like as well as Ti and Au.

In the foregoing, laser light with a high output and low contact resistance is obtained by applying a low voltage, and moreover, a vertical resonator type surface light emitting semiconductor laser device having high reliability is fabricated without a lowering of laser output over time.

EXAMPLE 2

Figure 4:
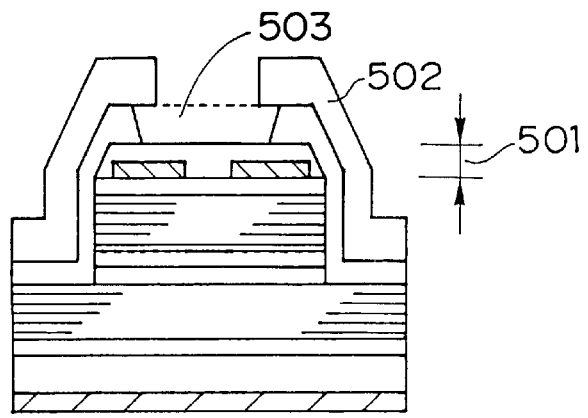
FIG. 4 and FIGS. 5A and 5B are illustrative views partially illustrating an example of the method of fabricating the vertical resonator type surface light emitting semiconductor laser device according to the first aspect of the present invention.
Figure 5A:
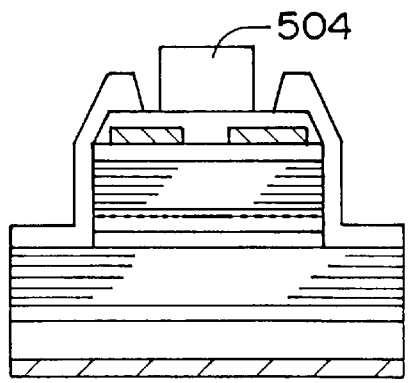
Figure 5B:
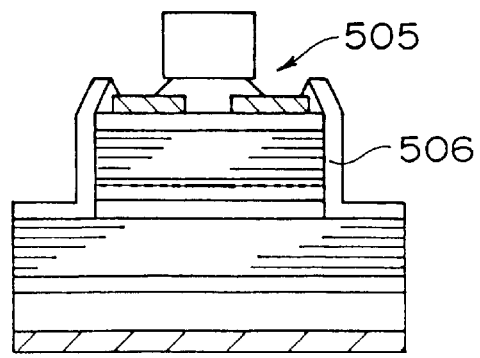

As in Example 1, after the steps shown in FIGS. 3A to 3H are carried out, in order to form a contact hole at the upper part of the post structure of the VCSEL thin film substrate, there is fabricated a vertical resonator type surface light emitting semiconductor laser device by replacing the steps (9) and (10) carried out in Example 1 (FIGS. 3I to 3J) with the steps (9-a), (10-a), and (10-b) described below (FIG. 4 and FIGS. 5A and 5B).

Hereinafter, a specific fabrication method will be described with reference to FIG. 4 and FIGS. 5A and 5B.

(9-a) Etching a Center of an Insulating Film at the Upper Part of a Post Structure As shown in FIG. 3H, the entire post is fully coated in an inter-layer insulation layer 216 that is formed of SiON, and then, a resist 502 is formed on the inter-layer insulation layer 216. The resist 502 is patterned in the shape shown in FIG. 4 by means of photolithography. This resist 502 is employed as a mask, and only a center 503 of the inter-layer insulating film at the upper part of the post structure is etched by employing a buffered fluoric acid. The etching can be carried out by dry etching. At this time, etching is not carried out until a contact electrode is fully exposed, and etching is stopped at a depth such that the film thickness 501 of the protective film at the upper part of the opening of the contact electrode is a predetermined film thickness. The predetermined film thickness is preferably defined such that the reflectance of the reflection body of the VCSEL thin film substrate is maintained relatively high. After the above etching, the resist 502 is removed.

(10-a) Forming a Resist for Forming a Contact Hole

Next, as shown in FIG. 5A, a resist 504 is formed on a protective film immediately above the opening of a contact electrode by photolithography. The formed resist is employed as a mask, and another region is etched. As shown in FIG. 5B, the inter-layer insulating film and protective film are removed, and etching is stopped when the contact hole 505 is drilled. At this time, an inter-layer insulating film 506 on the protective film is etched, and the film thickness is smaller than the initial film thickness.

As shown in FIG. 5B, after the contact hole 505 is formed, a p-type wiring electrode is formed as in the step of (11) in Example 1.

In the foregoing, as in Example 1, laser light of high output and low contact resistance is obtained by applying a low voltage, and moreover, a vertical resonator surface light emitting laser device having high reliability is fabricated without a decrease in laser output over time.

EXAMPLE 3

Figure 6A:
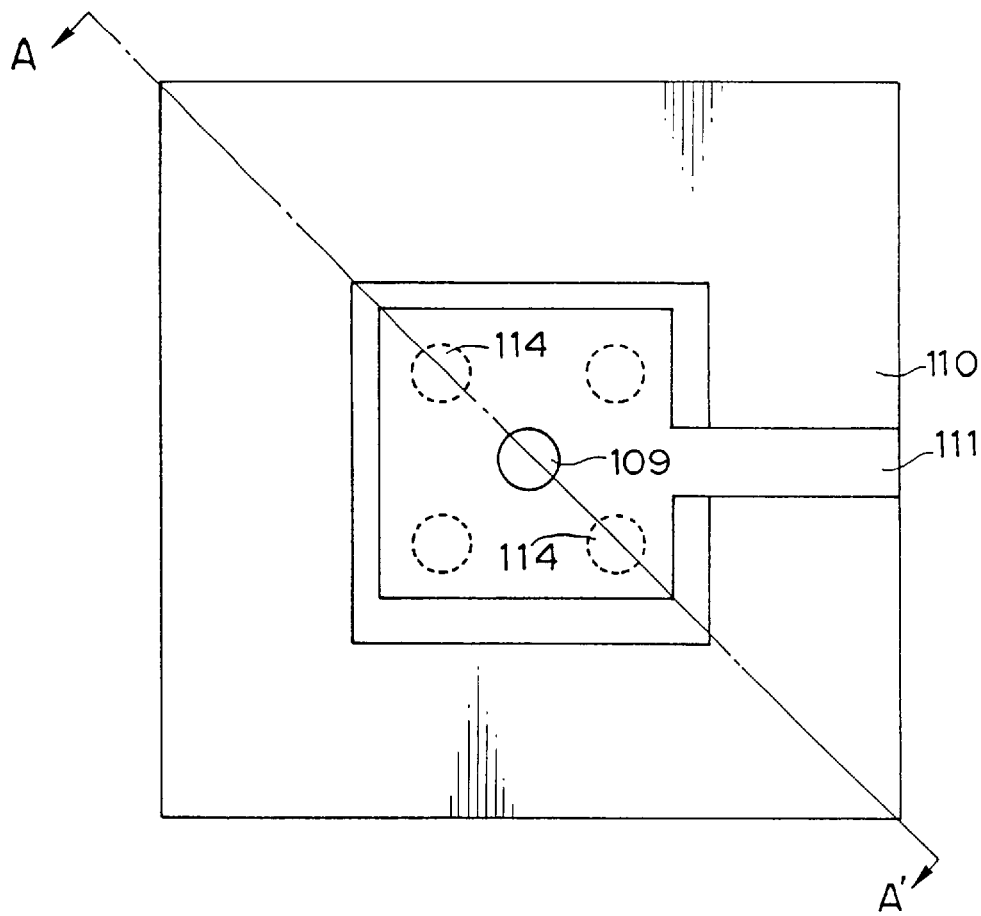
FIGS. 6A and 6B are a top view and sectional views along line A–A' showing an example of the vertical resonator type surface light emitting semiconductor laser device according to the first aspect of the present invention.
Figure 6B:
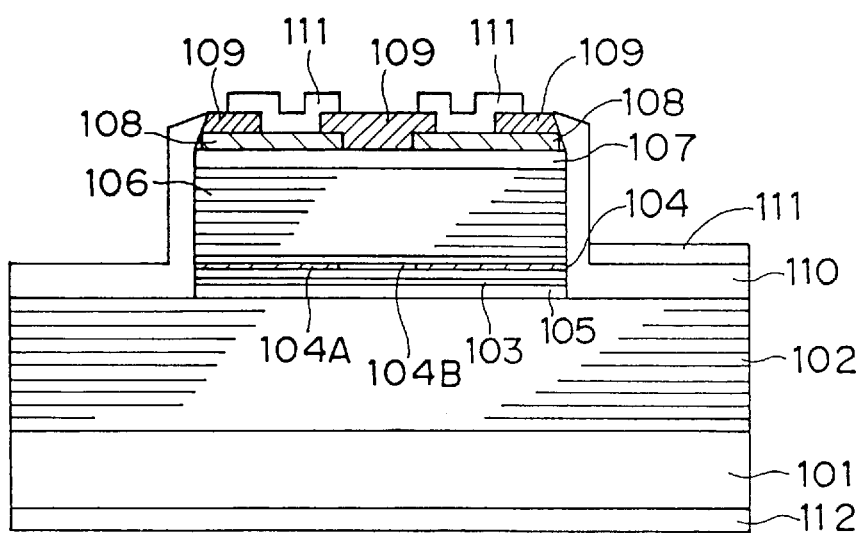

As in Example 1, after the steps shown in FIGS. 3A to 3I have been carried out, in order to form a contact hole at the upper part of a post structure of the VCSEL thin film substrate, a plurality of small contact holes 114 as shown in FIGS. 6A and 6B are formed in steps (9) and (10) carried out in Example 1, and a protective film 109 is formed so that the upper part of the post structure is fully covered, instead of a circular island shape as shown in FIGS. 1A and 1B. The contact hole 114 is not formed as an annular contact hole surrounding the protective film as shown in FIGS. 1A and 1B, and a plurality of small contact holes are disposed.

As described above, the shapes of the protective film and contact holes may have some variations, and may be constructed in any form without being limited in particular. FIGS. 6A and 6B are a top view and a sectional view taken along line A–A' showing an example of the vertical resonator type surface light emitting semiconductor laser device according to the present invention.

As in Example 1, laser light having high output and low contact resistance is obtained by applying a low voltage, and moreover, a vertical resonator surface light emitting laser device having high reliability is fabricated without a decrease in laser output over time.

EXAMPLE 4

In Example 1, a protective film and an etching mask are formed by employing the same kind of film. In this Example, the protective film formed after forming the contact electrode is formed by an SiON film. Immediately after the protective film is formed, the protective film is patterned, and the protective film is fabricated in advance in final shape. Then, a post etching mask and an inter-layer insulating film are formed of an $SiN_x$ film different from the protective film on the patterned protective film, and the already patterned protective film is left as is. Then, a contact hole is formed so that only the inter-layer insulating film and post etching mask are selectively removed by dry etching.

Figure 8A:
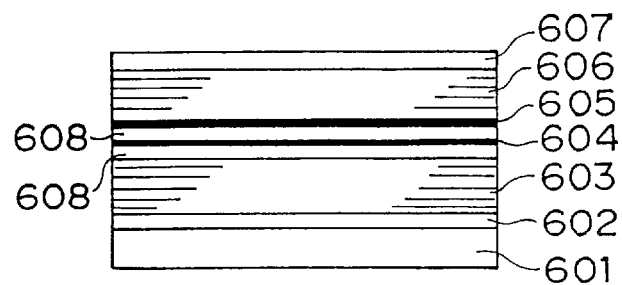
FIGS. 8A to 8N are illustrative views partially illustrating an example of the method of fabricating the vertical resonator type surface light emitting semiconductor laser device according to the first aspect of the present invention.

Hereinafter, a specific fabrication method will be described with reference to FIGS. 8A to 8N.

(1) Fabricating a VCSEL Thin Film Substrate (Semiconductor Substrate)

First, a bulk crystal of a III–V family compound semiconductor such as GaAs was employed as a substrate on which a III–V family compound (GaAs, AlGaAs) semiconductor thin film is epitaxially grown sequentially by using a metal organic vapor phase epitaxy (MOVPE) method, whereby a plurality of layers are formed and laminated, and a first conductivity type semiconductor multi-layered film reflection mirror 603 is formed. On the semiconductor multi-layered film reflection mirror 603, as described previously, there are provided at least an active layer, a spacer, a second conductivity type semiconductor multi-layered film DBR reflection mirror, and a contact layer. Hereinafter, this substrate is referred to as "VCSEL thin film substrate". A specific description will be given below.

That is, on a Si doped ($N_d=1\times10^{18}$ $cm^{-3}$) n-type GaAs semiconductor substrate 601, there are laminated sequentially: an Si doped ($N_d=1\times10^{18}$ $cm^{-3}$) n-type GaAs buffer layer 602; a 40.5 cycle Si doped ($N_d=1\times10^{18}$ $cm^{-3}$) n-type $Al_{0.3}Ga_{0.7}As/Al_{0.9}Ga_{0.1}As$ distribution brag reflection mirror (DBR layer) 603; an undoped λ $Al_{0.6}Ga_{0.4}As$ spacer layer 608; a triple quantum well $Al_{0.11}Ga_{0.89}As/Al_{0.3}Ga_{0.7}As$ active layer 604; a Zn doped ($Na=7\times10^{17}$ $cm^{-3}$) p-type AlAs layer 605; 30.5 cycle Zn doped ($Na=7\times10^{17}$ $cm^{-3}$) p-type $Al_{0.3}Ga_{0.7}As/Al_{0.9}Ga_{0.1}As$ DBR layer 606; and a Zn doped ($Na=1\times10^{19}$ $cm^{-3}$) p-type GaAs layer 607.

On the interface of each layer of the p-type $Al_{0.3}Ga_{0.7}As/Al_{0.9}Ga_{0.1}As$ distribution brag reflection mirror (DBR layer), a band barrier buffer layer having a composition between $Al_{0.3}Ga_{0.7}As$ and $Al_{0.9}Ga_{0.1}As$ may be inserted in order to reduce serial resistance of the device.

(2) Fabricating a p-type Contact Electrode Having an Opening

Figure 8B:
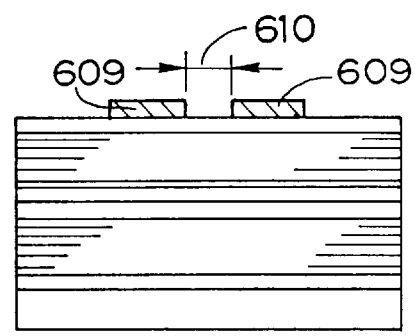

Next, as shown in FIG. 8B, a p-type contact electrode 609 having an opening 610 for laser emission is fabricated as follows on the surface of a contact layer 607 that is the outermost layer of the VCSEL thin film substrate fabricated by the MOVPE method. This p-type contact electrode can be preferably fabricated by using a lift-off method in which a resist pattern is formed on the surface of the contact layer 607 that is the outermost layer by means of general photolithography, Ti and Au are sequentially film deposited, and the resist is peeled off to form an electrode; or by using a method in which Ti and Au are film deposited in advance, a resist pattern is formed on the Au film by means of general photolithography, and Ti and Au are etched and patterned. The p-type contact electrode may be made of AuZn/Au or Ti/Pt/Au or the like as well as Ti and Au.

(3) Fabricating a Protective Film

Figure 8C:
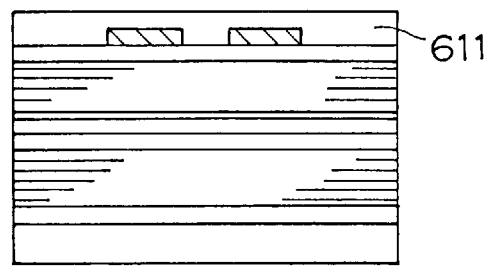

As shown in FIG. 8C, after the contact electrode 609 is fabricated, by means of a CVD device or a sputtering device, an SiON film is film deposited on the entire surface of the VCSEL thin film substrate where the contact electrode 609 was formed, and a protective forming layer 611 is formed. The film thickness of the protective film 611 must be thicker than that eliminated by etching, since this film is also used as a mask for subsequent post etching.

(4) Patterning a Protective Film

Figure 8D:
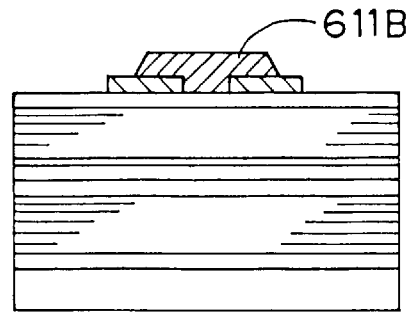

A resist is formed on the protective film 611, and the protective film is patterned as shown in FIG. 8D by fluoric acid based dry etching or buffered fluoric acid wet etching, whereby a protective film 611B is formed to make the final shape of the device.

(5) Film Depositing an n-type Back Face Electrode

Figure 8E:
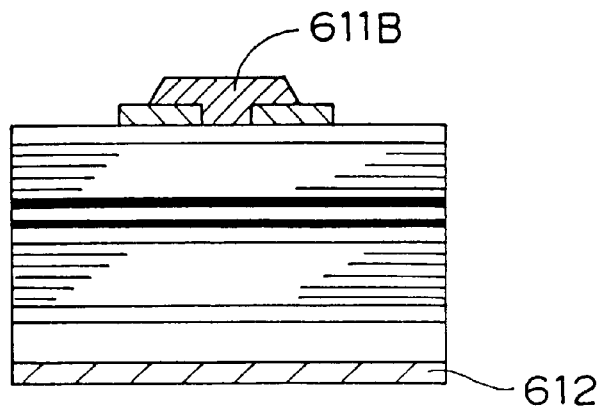

Here, as shown in FIG. 8E, an n-type electrode 612 is film deposited by vapor deposition device on the surface of the VCSEL thin film substrate where the protective film 611B is not provided. Thereafter, an annealing treatment is carried out for both of the ptype and n-type electrodes for several minutes to 30 minutes under a nitrogen environment at a temperature of 350 to 400° C., and an ohmic electrode is produced.

Figure 8F:
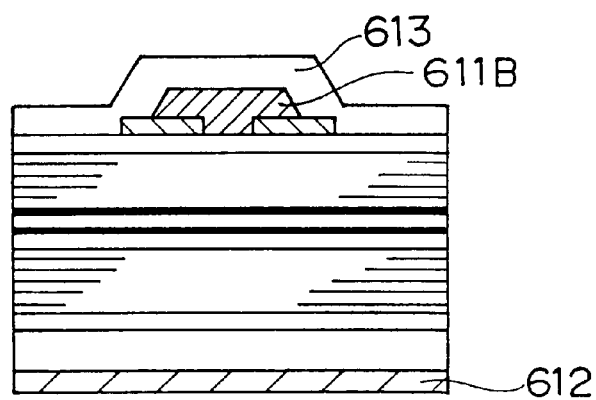

(6) Patterning a Mask by Film Depositing and Etching a Post Etching Mask Material In order to provide a columnar post structure, as shown in FIG. 8F, an $SiN_x$ film 613 is film deposited as a dry etching mask by means of the CVD method on the entire surface of the VCSEL thin film substrate where the protective film 611B or the like is provided.

Figure 8G:
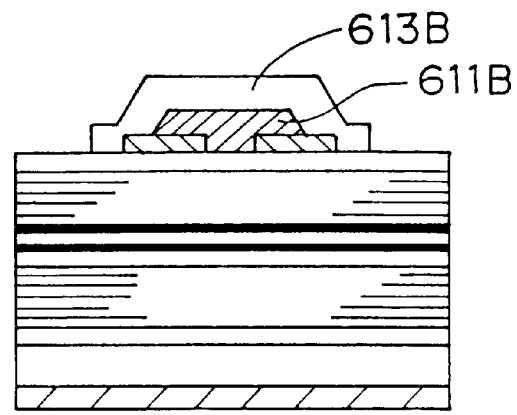

Thereafter, a resist is further formed on the $SiN_x$ film 613, the resist is employed as a mask, is the $SiN_x$ film 613 is etched, and a post etching mask 613B is formed (FIG. 8G).

(7) Forming a Post Structure

Figure 8H:
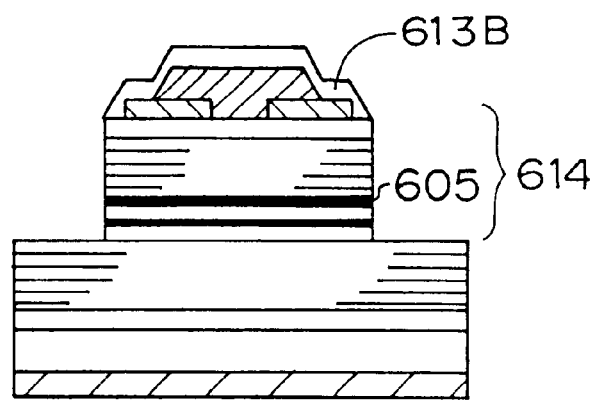

Next, a portion other than the etching mask 613B is dry etched by means of a dry etching device employing a chlorine based gas up to the depth of several microns to some of tens of microns such that up to ends of the AlAs layer 605 are exposed, and a post structure 614 as shown in FIG. 8H is formed. At this time, a cross section of the laminate film of the VCSEL thin film substrate is exposed to the side face of the post.

(8) AlAs Oxidization Step

Figure 8I:
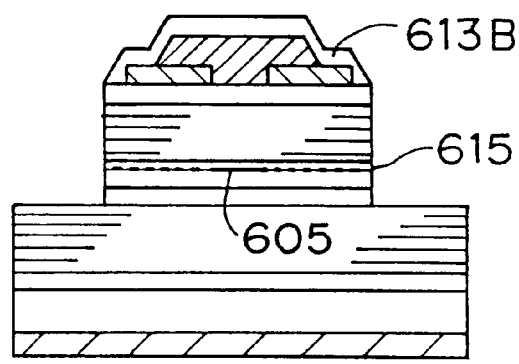
Figure 8J:
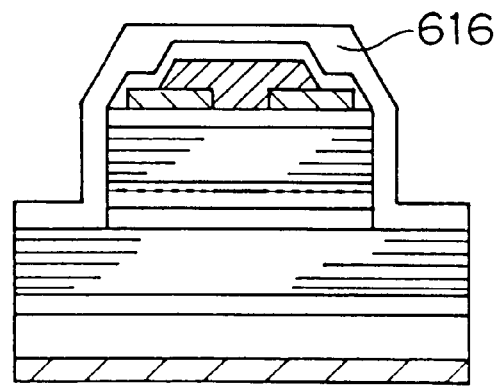

After the post structure has been fabricated, the structure is inserted into an annealing furnace, steam is introduced, and selective oxidization of the AlAs layer is carried out from the side face of the post (refer to FIG. 8I). At this time, the annealing temperature is set to about 350 to 400° C. In addition, the steam is introduced by bubbling hot water of 70 to 100° C. contained in a hot water tank with nitrogen carrier gas, and transporting it into the furnace. Although the AlGaAs and AlAs layers containing much Al are changed to Al oxides ($Al_xO_y$) by carrying out steam oxidization, the AlAs layer is overwhelmingly faster than the AlGaAs layer in oxidization velocity. Thus, only the AlAs layer is selectively oxidized from the wall end of the post to the center of the post, and an oxide layer 615 is formed. Then, by controlling the annealing time, the AlAs layer 605 can be left at a desired size at the center of the post.

The $Al_xO_y$ layer 615 has extremely low in electric conductivity, and the AlAs layer 605 has high electric conductivity. Thus, a structure can be provided such that a current flows only the AlAs layer 605 that is left at the center of the post structure.

(9) Film Depositing an Inter-layer Insulating Film

After AlAs oxidization has been carried out in the step of (8), as shown in FIG. 8H, the entire post is fully coated with an inter-layer insulating film 616 made of $SiN_x$.

(10) Forming a Resist for Forming a Contact Hole and Etching the Resist

Figure 8K:
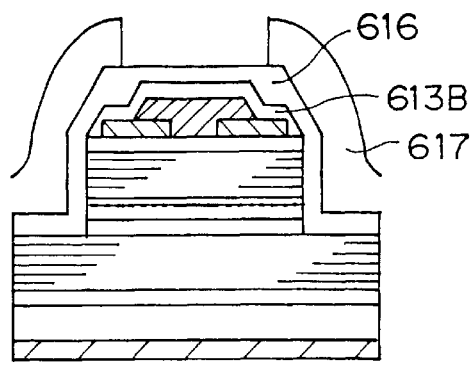

In order to drill a contact hole at the inter-layer insulating film 616 and the remaining film 613 of the post etching mask, as shown in FIG. 8K, a resist 617 is further formed on the inter-layer insulating film.

Figure 8L:
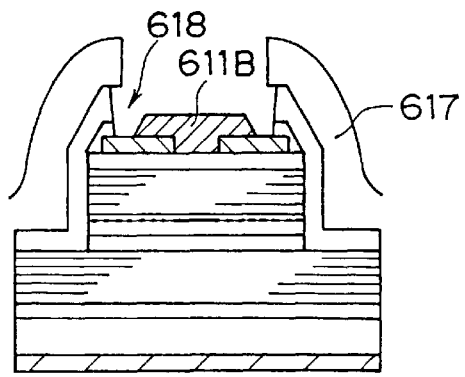

Thereafter, when etching is carried out by using a mixture gas of hexagonal sulfur fluoride ($SF_6$) and oxygen ($O_2$), the protective film 611 remains without being etched because the etching velocity of the protective film 611B made of an SiON film is lower than that of the post etching mask 613B made of $SiN_x$ and the inter-layer insulating film 616 positioned at upper portion thereof. As a result, only the post etching mask 613B and inter-layer insulating film 616 are selectively etched, and a contact hole 618 is formed at the periphery of the patterned protective film 611B as shown in FIG. 8L.

(11) Removing Resist

Figure 8M:
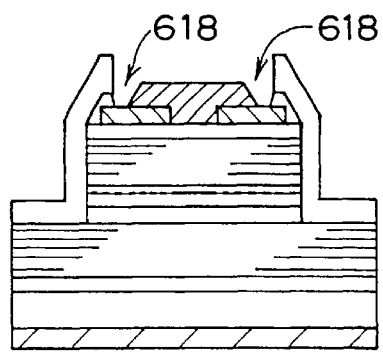

The resist 617 employed for forming a contact hole in the step of (10) is removed by organic washing or ashing (FIG. 8M).

(12) Forming a p-type Wiring Electrode

Figure 8N:
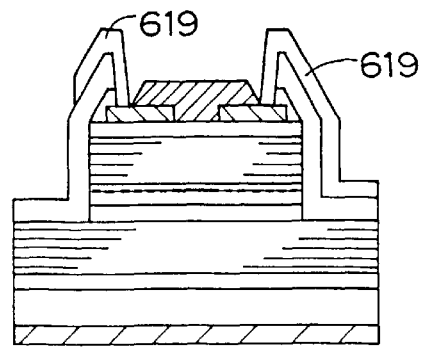

Last, a p-type wiring electrode 619 connected to a contact electrode is formed on an inter-layer insulating film 616, and a vertical resonator type surface light emitting semiconductor laser device according to the present invention, having the sectional structure shown in FIG. 8N, is fabricated.

The p-type wiring electrode 619 can be preferably formed by using the lift-off method in which a resist pattern is formed by general photolithography, Ti and Au are sequentially film deposited, and the resist is removed, or by using a method in which Ti and Au is film deposited in advance, a resist pattern is formed on an Au film by general lithography, and Ti and Au are etched and patterned. The p-type electrode may be made of AuZn/Au. Ti/Pt/Au or the like as well as Ti and Au.

In the foregoing, laser light having high output and low contact resistance is obtained by applying a low voltage, and moreover, a vertical resonator type surface light emitting semiconductor laser device having high reliability is fabricated without a decrease in laser output over time.

EXAMPLE 5

In this Example, a contact electrode is fabricated at the initial stage of the process, that is, before forming any structure other than a sacrifice layer on a contact layer. A vertical resonator type surface light emitting semiconductor laser device (AlAs oxidized VCSEL) having a structure similar to that shown in FIG. 1 is fabricated in accordance with the procedures shown below.

Figure 9A:
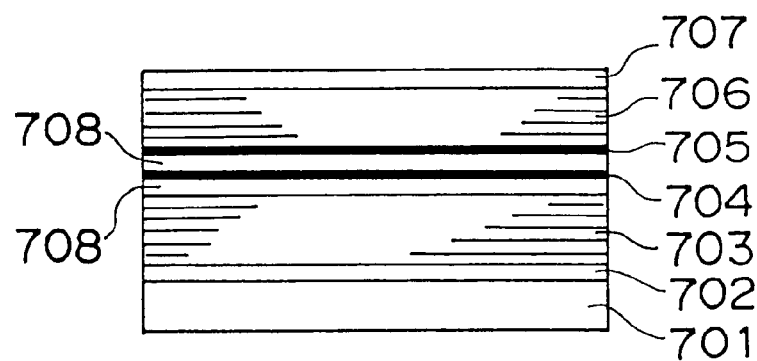
FIGS. 9A to 9N are illustrative views partially illustrating an example of the method of fabricating the vertical resonator type surface light emitting semiconductor laser device according to the first aspect of the present invention.

Hereinafter, a specific method of fabricating an AlAs oxidized VCSEL will be described with reference to FIGS. 9A to 9N by way of example.

(1) Fabricating a VCSEL Thin film Substrate (Semiconductor Substrate)

First, a bulk crystal of a III–V family compound semiconductor such as GaAs is employed as a substrate on which a III-V family compound (GaAs, AlGaAs) semiconductor thin film is epitaxially grown sequentially by using the metal organic vapor phase epitaxy (MOVPE) method, whereby a plurality of layers are formed, and a first conductivity type semiconductor multi-layered film reflection mirror 103 is formed. On the semiconductor multi-layered film reflection mirror 703, as described previously, there are provided at least an active layer, a spacer, a second conductivity type semiconductor multi-layered film DBR reflection mirror, and a contact layer. Hereinafter, this substrate is referred to as "VCSEL thin film substrate". A specific description will be given below.

That is, on a Si doped ($N_d=1\times10^{18}$ cm$^{-3}$) n-type GaAs semiconductor substrate 701, there are laminated sequentially: an Si doped ($N_d=1\times10^{18}$ cm$^{-3}$) n-type GaAs buffer layer 702; a 40.5 cycle Si doped ($N_d=1\times10^{18}$ cm$^{-3}$) n-type $Al_{0.3}Ga_{0.7}As/Al_{0.9}Ga_{0.1}As$ distribution brag reflection mirror (DBR layer) 703; an undoped A $Al_{0.6}Ga_{0.4}As$ spacer layer 708; a triple quantum well $Al_{0.11}Ga_{0.89}As/Al_{0.3}Ga_{0.7}As$ active layer 704; a Zn doped ($Na=7\times10^{17}$ cm$^{-3}$) p-type AlAs layer 705; 30.5 cycle Zn doped ($Na=7\times10^{17}$ cm$^{-3}$) p-type $Al_{0.3}Ga_{0.7}As/Al_{0.9}Ga_{0.1}As$ DBR layer 706; and a Zn doped ($Na=1\times10^{19}$ cm$^{-3}$) p-type GaAs layer 707.

On the interface of each layer of the p-type $Al_{0.3}Ga_{0.7}As/Al_{0.9}Ga_{0.1}As$ distribution brag reflection mirror (DBR layer), a band barrier buffer layer having a composition between $Al_{0.3}Ga_{0.7}As$ and $Al_{0.9}Ga_{0.1}As$ may be inserted in order to reduce the serial resistance of the device.

(2) Fabricating a p-type Contact Electrode Having an Opening

Film Depositing a Sacrifice Layer

Figure 9B:
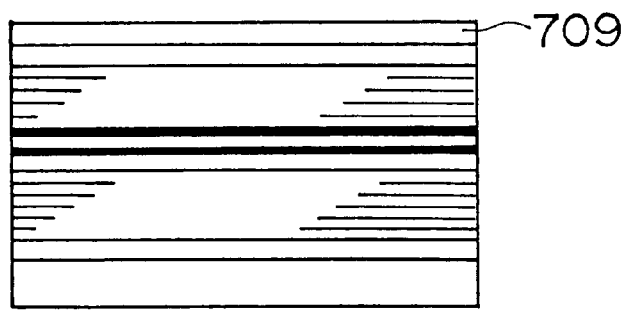

Next, as shown in FIG. 9B, SiON was film deposited on a contact layer 707 on the obtained VCSEL thin film substrate by means of a sputtering device, and a sacrifice layer 709 of 0.1 microns in film thickness was formed. At this time, the SiON has a film thickness such that a developing liquid is fully blocked in the subsequent photolithography step and does not contact the contact layer 707 made of GaAs.

Forming a Resist for Lifting off a contact Electrode

Figure 9C:
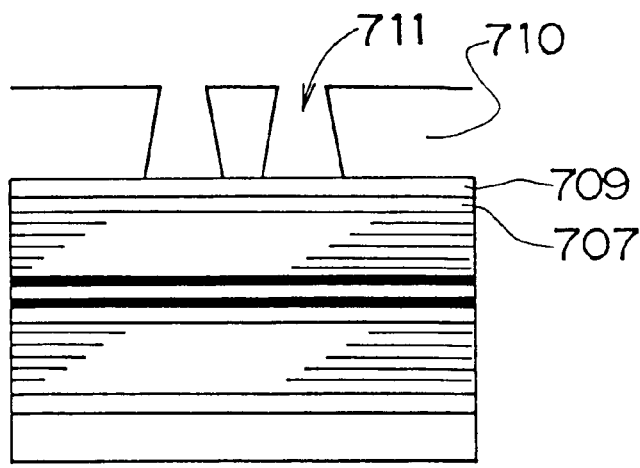
Figure 9D:
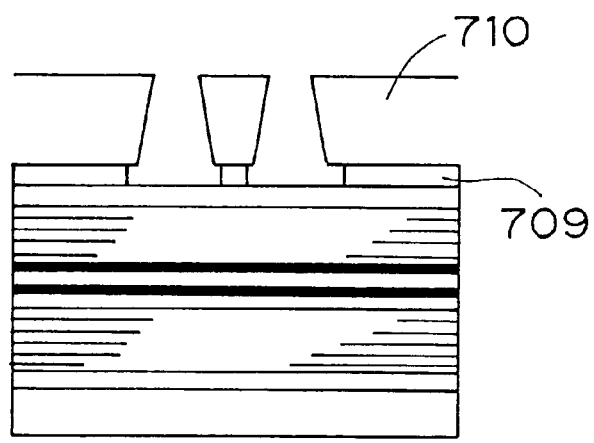

Then, as shown in FIG. 9C, a resist for lifting off a contact electrode is formed on an SiON film of the sacrifice layer in accordance with the following procedure. That is, a coating liquid-like resist is fully applied onto the SiON film of the sacrifice layer, and is pre-baked. Then, the pre-baked film is subjected to exposure in a negative pattern of the contact electrode (patterning), the exposed film is developed with a resist developing liquid, and an opening 711 is formed. At this time, a sacrifice layer made of SiON is present in the lower layer of the resist so that a contact layer made of GaAs does not come into direct contact with the developing liquid. Therefore, etching caused by the developing liquid of the contact layer can be effectively avoided.

Etching a Sacrifice Layer in the Same Resist Pattern

At this stage, as shown in FIG. 9C, the SiON film of the sacrifice layer 709 in the region of the opening 711 of the patterned resist covers the contact layer 707. Therefore, even if an electrode metal is film deposited in this state, the metal is merely film deposited on the sacrifice layer. Thus, the contact layer and the electrode metal do not contact each other, and current is not injected into the device. Because of this, with the resist pattern 710 being provided, the sacrifice layer 709 (SiON film) in the region of the opening 711 is fully etched, and the lower contact layer (GaAs layer) 707 is exposed.

The etching resistance of the GaAs layer with respect to buffered fluoric acid is sufficient at this stage, and the GaAs contact layer is not etched by this etching.

Film Depositing an Electrode Metal (Forming a Contact Electrode)

Figure 9E:
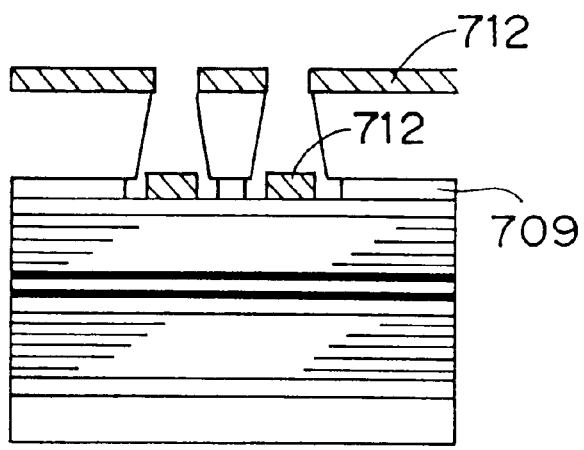
Figure 9F:
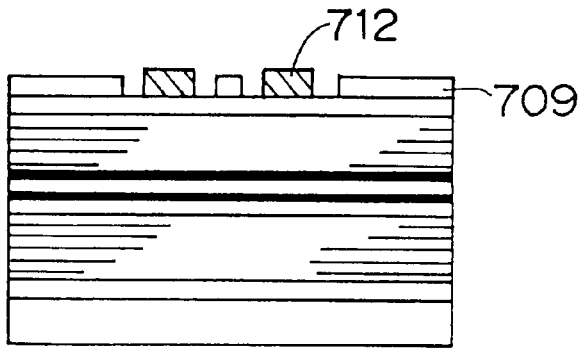

Ti and Au are sequentially film deposited by means of resistance heating steam, electron beam steam or sputtering as shown in FIG. 9E, and an electrode metal 712 (contact electrode) is formed.

Lifting off a Resist and Removing a Sacrifice Layer

After the electrode metal 712 is formed, the resist 710 is removed together with the electrode metal 712 by organic washing or by employing a resist release liquid.

Figure 9G:
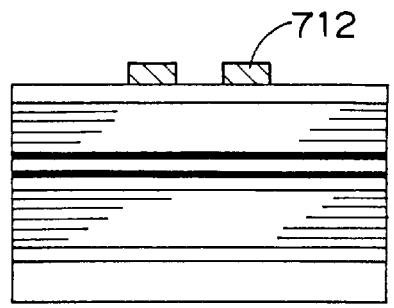

Last, the remaining sacrifice layer 709 is removed with a buffered fluoric acid, and only the contact electrode 712 having an opening is formed on the contact layer as shown in FIG. 9G.

A description of the method of forming the contact electrode by employing the sacrifice layer has now been completed. The sacrifice layer is applicable to an insulating film which is deposited by sputtering or an insulating film which is deposited with $SiO_2$, $SiN_x$ or CVD, without being limited to the SiON film.

In comparing the sputtered film with the CVD film, the sputtered film is more preferable in that the lower GaAs contact layer is less affected. In addition, the sacrifice layer may be a film which is cured and hardened by spin coating SOG. When the SOG curing temperature is 250° C. or less, the oxidization of the contact layer surface can be reduced, and a low contact resistance is obtained. Further, even if the sacrifice layer is not an insulating film, it may be $In_xSn_yO_z$ which is a transparent electrode material. A hydrochloric solution is preferable as etchant for removing the sacrifice layer.

(3) Film Depositing an n-type Back Face Electrode

Figure 9H:
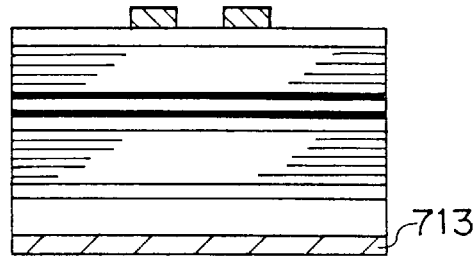

Here, as shown in FIG. 9H, an n-type electrode 713 is film deposited by a vapor deposition device on the surface of the VCSEL thin film substrate on which the contact electrode 712 is not provided. The n-type electrode is made of AuGe/Au or AuGe/ Ni/Au.

In addition, annealing is carried out for several to 30 minutes under the atmosphere of nitrogen at a temperature of 350 to 400° C. in order to produce both of the electrodes as low-resistance ohmic electrodes.

(4) Forming a Post Etching Mask

Figure 9I:
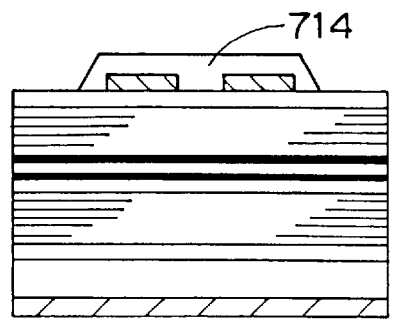

After the contact electrode 712 is formed, by means of the CVD device or sputtering device, an insulating film made of SiON, $SiN_x$, $SiO_2$ films is film deposited on the entire surface of the VCSEL thin film substrate where the contact electrode 712 is formed. Then, a resist pattern is formed on an insulating film by general photolithography, that is, by resist application, exposure, and developing. The insulating film is etched by the buffered fluoric acid, and a resist is further removed, whereby a post etching mask 714 is formed as shown in FIG. 9I. The insulating film may be etched by dry etching using fluorine based gas.

(5) Forming a Post Structure

Figure 9J:
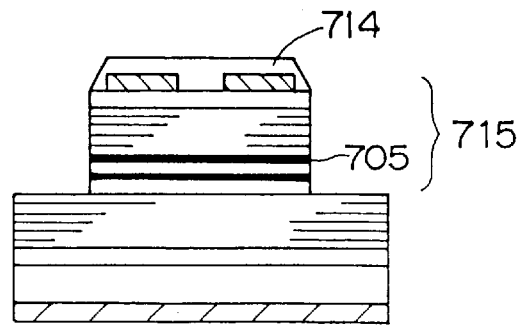

Next, a portion other than the etching mask 714 is dry etched by means of a dry etching device employing a chlorine based gas up to the depth of several microns to some of tens of microns such that up to ends of the AlAs layer 705 are exposed, and a post structure 715 as shown in FIG. 9J is formed. At this time, a cross section of the laminate film (reflection body) of the VCSEL thin film substrate is exposed to the side face of the post structure.

(6) AlAs Oxidization Step

Figure 9K:
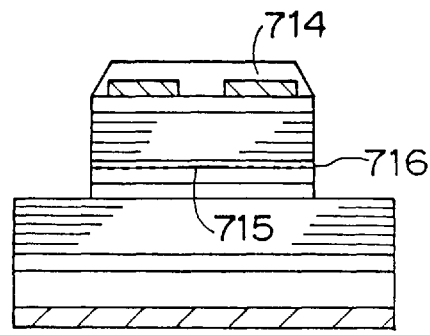

After the post structure has been fabricated, the structure is inserted into an annealing furnace, steam is introduced, and selective oxidization of the AlAs layer is carried out from the side face of the post (refer to FIG. 9K). At this time, the annealing temperature is set to about 350 to 400° C. In addition, the steam was introduced by bubbling hot water of 70 to 100° C. contained in a hot water tank with nitrogen carrier gas, and transporting it into the furnace. Although the AlGaAs and AlAs layers containing much Al are changed to Al oxides ($Al_xO_y$) by carrying out steam oxidization, the AlAs layer is overwhelmingly faster than the AlGaAs layer in oxidization velocity. Thus, only the AlAs layer is selectively oxidized from the wall end of the post to the center of the post, and an $Al_xO_y$ layer 716 is formed. Then, by controlling the annealing time, the AlAs layer 715 can be left at a desired size at the center of the post. The $Al_xO_y$ layer 716 has very low electric conductivity, and the AlAs layer 715 has high electric conductivity. Thus, a structure can be provided such that current flows only in the AlAs layer 715 that is left at the center of the post structure.

(7) Film Depositing an Inter-layer Insulating Film

Figure 9L:
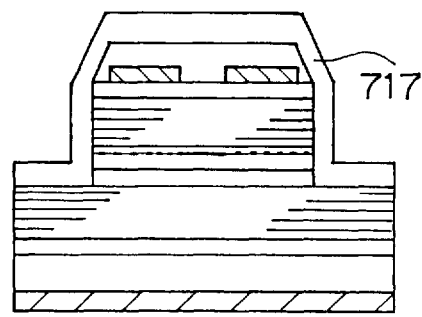

After AlAs oxidization has been carried out in the step of (6), as shown in FIG. 9L, the entire post is fully coated with an inter-layer insulating film 717 made of $SiO_2$, SiON, $SiN_x$. This coating is carried out in order to compensate for the lowasd strength of the post itself caused by substantially of the AlAs layer being substituted by a porous $Al_xO_y$ film, and in order to prevent the transforming of the oxide layer by the porous $Al_xO_y$ film being placed to be exposed at the end of the side wall of the post.

(8) Forming a Contact Hole

Figure 9M:
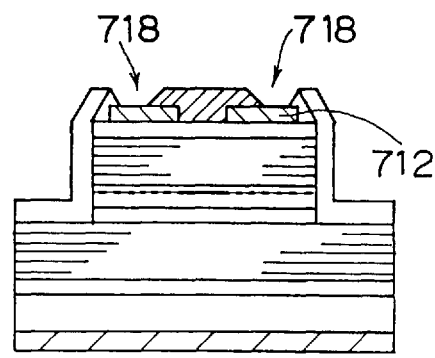

Further, by patterning and etching using photolithography, as shown in FIG. 9M, there is drilled a contact hole 718 for grounding a p-type wiring electrode on a contact electrode that is present in the lower layer of the protective film and inter-layer insulating film. Etching can be performed by etching using chemicals such as buffered fluoric acid (BHF) or dry etching.

(9) Forming a p-type Wiring Electrode

Figure 9N:
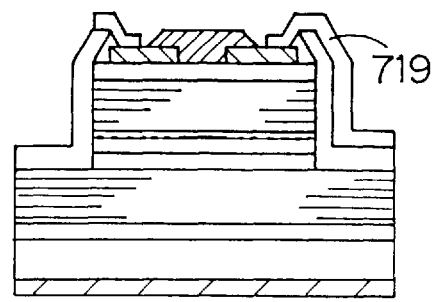

Last, a p-type wiring electrode 719 connected to a contact electrode is formed on an inter-layer insulating film 717, and a vertical resonator type surface light emitting semiconductor laser device according to the present invention, with the sectional structure shown in FIG. 9N, is fabricated.

The p-type wiring electrode 719 can be preferably formed by using the lift-off method in which a resist pattern is formed by general photolithography, Ti and Au are sequentially film deposited, and the resist is removed; or by using a method in which Ti and Au are film deposited in advance, a resist pattern is formed on an Au film by general photolithography, and Ti and Au are etched and patterned. The p-type electrode materials may be made of AuZn/Au, Ti/Pt/Au or the like as well as Ti and Au.

In the foregoing, laser light of a high output and low contact resistance is obtained by applying a low voltage, and moreover, a vertical resonator type surface light emitting semiconductor laser device having high reliability without a decrease in laser output over time is fabricated.

EXAMPLE 6

A vertical resonator type surface light emitting semiconductor laser device (the second embodiment of the present invention) having a structure similar to that shown in FIGS. 10A and 10B is fabricated as follows.

On an Si doped ($N_d=1\times10^{18}$ cm$^{-3}$) n-type GaAs semiconductor substrate 101, there are formed and sequentially laminated: a 40.5 cycle Si doped ($N_d=1\times10^{18}$ cm$^{-3}$) n-type Al$_{0.3}$Ga$_{0.7}$As/Al$_{0.9}$Ga$_{0.2}$As distribution brag reflection mirror (DBR layer) 102; an undoped λ/Al$_{0.6}$Ga$_{0.4}$As spacer layer 105; a triple quantum well Al$_{0.11}$Ga$_{0.89}$As/Al$_{0.3}$Ga$_{0.7}$As active layer 103; Zn doped (Na=7×10$^{17}$ cm$^{-3}$) p-type AlAs layer 104; 30.5 cycle Zn doped (Na=7×10$^{17}$ cm$^{-3}$) p-type Al$_{0.3}$Ga$_{0.7}$As/Al$_{0.9}$Ga$_{0.1}$As DBR layer 106; Zn doped (Na=1×10$^{19}$ cm$^{-3}$) p-type GaAs layer (contact layer) 107 (Si doped n-type GaAs buffer layer is not shown). The Zn doped (Na=7×10$^{17}$ cm$^{-3}$) p-type AlAs layer 104 is formed by an oxidized region 104A and a non-oxidized region 104B.

Further, a protective film 109 made of SiO$_x$N$_y$ is formed on the GaAs contact layer 107 in direct contact with the layer, and there is formed a contact electrode 108 superimposed on the protective film 109, the contact electrode 108 having an opening 113 for laser emission which opening 113 is in a substantially flat region of the protective layer. Further, a mask 115 made of SiN$_x$ is provided. The opening 113 is fully covered with the SiON protective film 109. The diameter of the protective film 109 is restricted to a desired diameter by means of the contact electrode 108.

In addition, an inter-layer insulating film 110 having a contact hole 114 is formed on the contact electrode 108, and a wiring electrode 111 is formed on the inter-layer insulating film in contact with the contact electrode 108. The wiring electrode 111 is in contact with a flat surface region on the contact electrode, that is, the contact hole 114. In the contact hole 114, the surface of the contact layer 107 at that region is covered with the contact electrode 108, and the contact layer is not exposed.

Hereinafter, a specific fabrication method of an AlAs oxidized VCSEL according to the second embodiment of the present invention will be described with reference to FIGS. 11A to 11J by way of example.

(1) Fabricating a VCSEL Thin Film Substrate (Semiconductor Substrate)

Figure 11A:
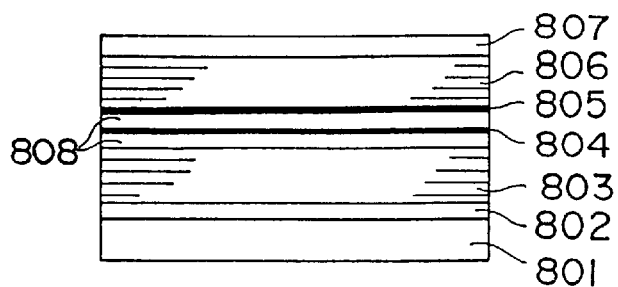
FIGS. 11A to 11J are illustrative views partially illustrating an example of a vertical resonator type surface light emitting semiconductor laser device according to a second aspect of the present invention.

As in Example 4, a VCSEL thin film substrate as shown in FIG. 11A is fabricated by using the MOVPE method.

(2) Fabricating a Protective Film

Figure 11B:
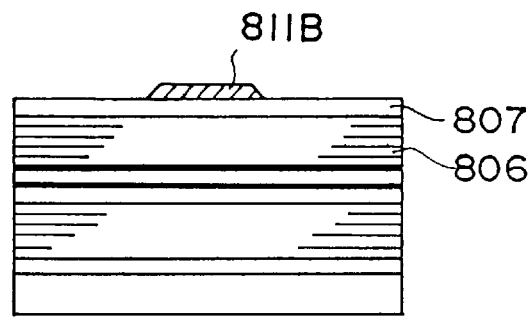

On the surface of a contact layer 807 that is the outermost layer of the above fabricated VCSEL thin film substrate, an SiO$_x$N$_y$ is deposited in a region that is a laser emitting port by means of the CVD method or sputtering or the like (the protective film forming layer is not shown). Then, a resist pattern is formed by general photolithography; SiO$_x$N$_y$ is etched by wet etching or dry etching employing buffered fluoric acid (BHF) or the like; the resist is removed; and a protective film 811B of a desired shape is formed as shown in FIG. 11B. The film thickness of the protective film 811B is slightly etched when the contact hole was subsequently formed. Thus, in consideration of the etching selectivity ratio of the inter-layer insulating film to the material type, the thickness is such that the reflectance of a reflection mirror formed by the protective film 811B, a second conductivity type semiconductor multi-layered film DBR reflection mirror 806 and the contact layer 807 is substantially extremely large.

(3) Fabricating a p-type Contact Electrode Having an Opening

Figure 11C:
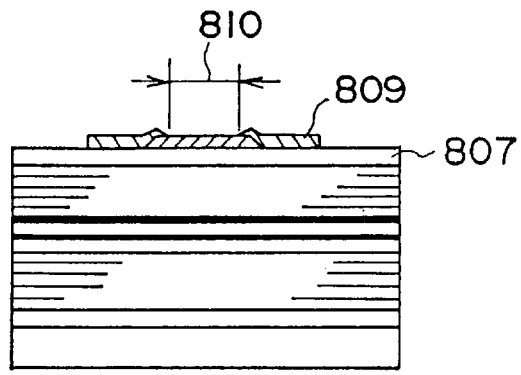

Next, as shown in FIG. 11C, a p-type contact electrode 809 having an opening 810 for laser emission is fabricated as follows on the surface of a contact layer 807 that is the outermost layer of the VCSEL thin film substrate fabricated by the MOVPE method. This p-type contact electrode can be preferably fabricated by using a lift-off method in which a resist pattern is formed on the surface of the contact layer 807 that is the outermost layer by means of general photolithography, Ti and Au are sequentially film deposited, and the resist is removed to form the electrode; or by using a method in which Ti and Au are film deposited in advance, a resist pattern is formed on the Au film by means of general photolithography, and Ti and Au are etched and patterned. The p-type contact electrode may be made of AuZn/Au or Ti/Pt/Au or the like as well as Ti and Au.

(4) Film Depositing an n-type Back Face Electrode

Figure 11D:
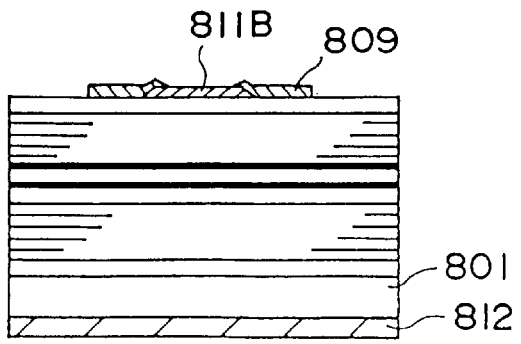
Figure 11E:
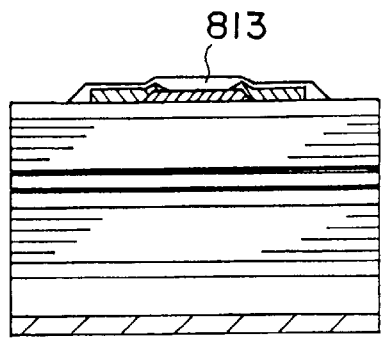

Here, as shown in FIG. 11D, an n-type electrode 812 is film deposited by a vapor deposition apparatus on the surface of the VCSEL thin film substrate where the protective film 811B is not provided. Thereafter, an annealing treatment is carried out for both of the p-type and n-type electrodes for several minutes to 30 minutes under a nitrogen environment at a temperature of 350 to 400° C., and an ohmic electrode was produced.

(5) Patterning a Mask by Film Depositing and Etching a Post Etching Mask Material In order to provide a columnar post structure, an SiN$_x$ film is film deposited as a dry etching mask by means of the CVD method or sputtering on the entire surface of the VCSEL thin film substrate where the protective film 811 or the like is provided. Thereafter, a resist is further formed on the SiN$_x$ film by general photolithography. By using the resist as a mask, wet etching by employing fluoric acid based etchant is carried out to conduct patterning, and a post etching mask 813B is formed (FIG. 11G).

(6) Forming a Post Structure

Figure 11F:
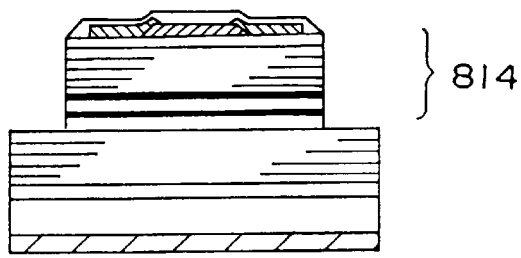
Figure 11G:
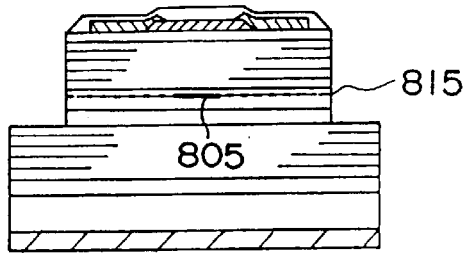

Next, a portion other than the etching mask 813 is dry etched by means of a dry etching device employing a chlorine based gas up to the depth of several microns to some of tens of microns in which up to ends of the AlAs layer 805 are exposed, and a post structure 814 as shown in FIG. 11F is formed. At this time, a cross section of the laminate film of the VCSEL thin film substrate is exposed to the side face of the post.

(7) AlAs Oxidization Step

After the post structure has been fabricated, the structure is inserted into an annealing furnace, steam is introduced, and selective oxidization of the AlAs layer is carried out from the side face of the post (refer to FIG. 11G). At this time, the annealing temperature is set to about 350 to 400° C. In addition, the steam is introduced by bubbling hot water of 70 to 100° C. contained in a hot water tank with nitrogen carrier gas, and transporting it into the furnace. Although the AlGaAs and AlAs layers containing much Al are changed to Al oxides (Al$_x$O$_y$) by carrying out steam oxidization, the AlAs layer is overwhelmingly faster than the AlGaAs layer in oxidization velocity. Thus, only the AlAs layer is selectively oxidized from the wall end of the post to the center of the post, and an oxide layer 815 is formed. Then, by controlling the annealing time, the AlAs layer 805 can be left at a desired size at the center of the post. The Al$_x$O$_y$ layer 815 has very low electric conductivity, and the AlAs layer 805 has high electric conductivity. Thus, a structure can be provided such that a current flows only in the AlAs layer 805 that is left at the center of the post structure.

(8) Film Depositing an Inter-layer Insulating Film

Figure 11H:
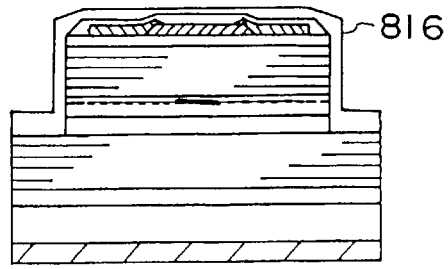
Figure 11:
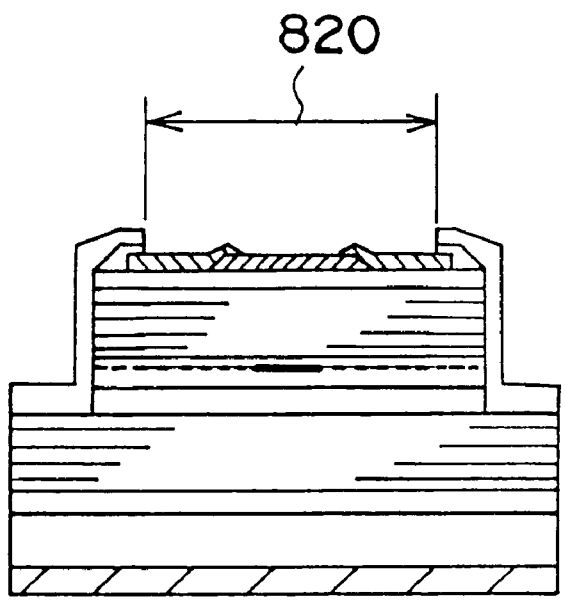
Figure 11:
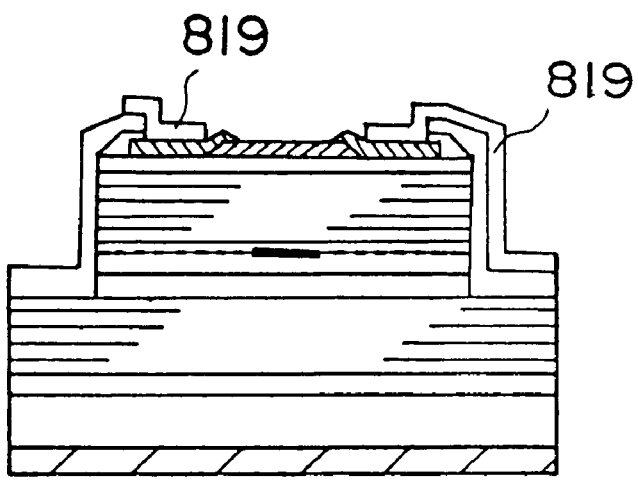

After AlAs oxidization has been carried out in the step of (7), as shown in FIG. 11H, an SiN$_x$ film is film deposited by a CVD device or a sputtering device, and the entire post is fully coated with an inter-layer insulating film 816 made of $SiN_x$. This coating is carried out in order to compensate for the lowasd strength of the post itself caused by substantially of the AlAs layer 805 being substituted by a porous $Al_xO_y$ film, and in order to prevent the transforming of the oxide layer by the porous $Al_xO_y$ oxidized layer being placed to be exposed at the end of the side wall of the post. As the inter-layer insulating film, $SiO_2$, $SiO_xN_y$ or the like may be used.

(9) Forming a Contact Hole

Next, the inter-layer insulating film 816 and the post etching mask 813 are etched by dry etching (FIG. 11I). The dry etching conditions are determined such that the inter-layer insulating film 816 and the post etching mask 813 can be selectively etched, and the protective film 811B is hardly etched at all.

(10) Forming a p-type Wiring Electrode

Last, a p-type wiring electrode 819 connected to a contact electrode is formed on an inter-layer insulating film 816, and a vertical resonator type surface light emitting semiconductor laser device according to the present invention, which has the sectional structure shown in FIG. 11J, is fabricated.

The p-type wiring electrode 819 can be preferably formed by using the lift-off method in which a resist pattern is formed by general photolithography, Ti and Au are sequentially film deposited, and the resist is removed; or by using a method in which Ti and Au are deposited in advance, a resist pattern is formed on an Au film by general photolithography, and Ti and Au are etched and patterned. The p-type electrode may be made of AuZn/Au. Ti/Pt/Au or the like as well as Ti and Au.

In the foregoing, laser light having high output and low contact resistance is obtained by applying a low voltage, and moreover, a vertical resonator type surface light emitting semiconductor laser device having high reliability is fabricated without having a decrease in laser output over time.

EXAMPLE 7

As in Example 6, after the steps shown in FIGS. 11A to 11H are carried out, in order to form a contact hole at the upper part of the post structure of the VCSEL thin film substrate, the vertical resonator type surface light emitting semiconductor laser device is fabricated by replacing the steps of (9) and (10) (FIGS. 11I to 11J) carried out in Example 6 with the steps of (9-a) and (9-b) (FIGS. 12A and 12B) described below.

Figure 12A:
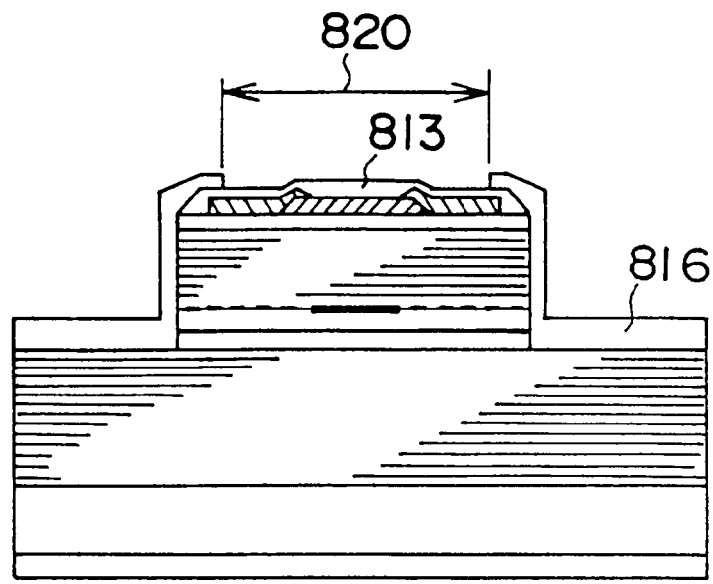
FIGS. 12A and 12B are illustrative views partially illustrating an example of the method of fabricating the vertical resonator type light emitting semiconductor laser device according to the second aspect of the present invention.

Hereinafter, a specific fabrication method will be described with reference to FIGS. 12A and 12B.

(9-a) Forming a Contact Hole 1

As shown in FIG. 3H, after the entire post is fully covered with the inter-layer insulating film 816 made of $SiN_x$, a resist is formed on the inter-layer insulating film 816, and is patterned by photolithography. When this resist is employed as a mask, the center of the inter-layer insulating film at the upper part of the post structure is etched in the shape shown in FIG. 12A by employing buffered fluoric acid (BHF), whereby a contact hole forming via 820 is formed. The etching can be carried out by dry etching. At this time, the post etching mask 813 may be etched simultaneously to an extent such that the protective film 811B and contact electrode 809 are not exposed.

(9-b) Forming a Contact Hole 2

Figure 12B:
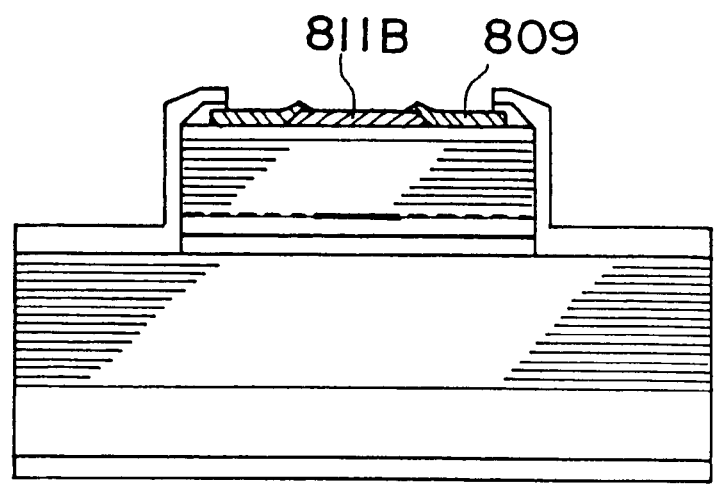

Then, the post etching mask 813 in the contact hole forming via 820 is etched by dry etching (refer to FIG. 12B). In this case as well, the dry etching conditions are selected such that the post etching mask 813 can be selectively etched, and the protective film 811B is hardly etched. However, the thickness of the film to be dry etched can be reduced. Therefore, the over etching time can be reduced, an effect on the protective layer can be reduced, or the etching condition of a small etching selectivity ratio is small can be applied.

EXAMPLE 8

Figure 13A:
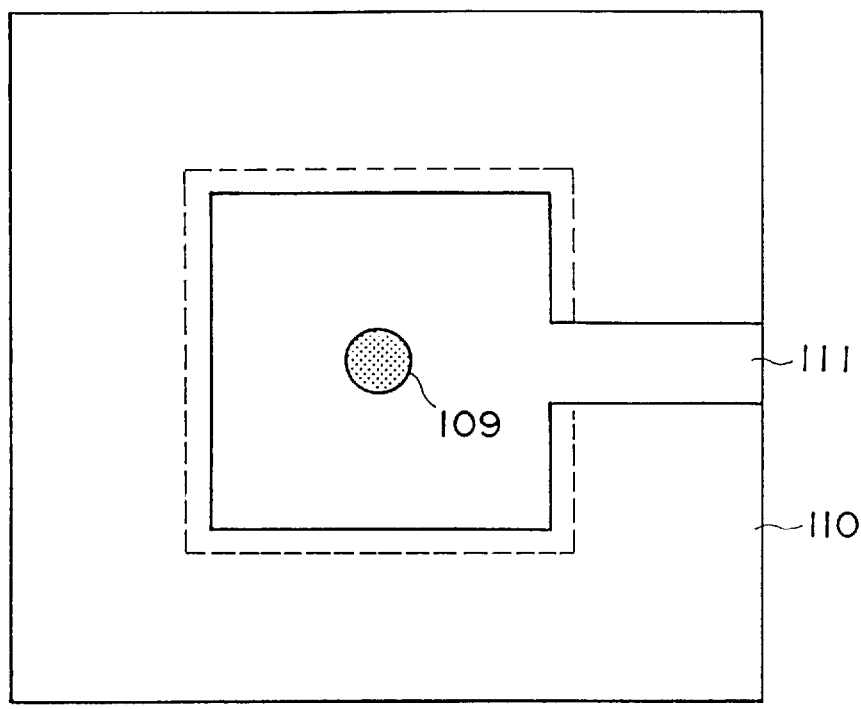
FIGS. 13A and 13B are top and side sectional views showing an example of the vertical resonator type surface light emitting semiconductor laser device according to the second aspect of the present invention.
Figure 13B:
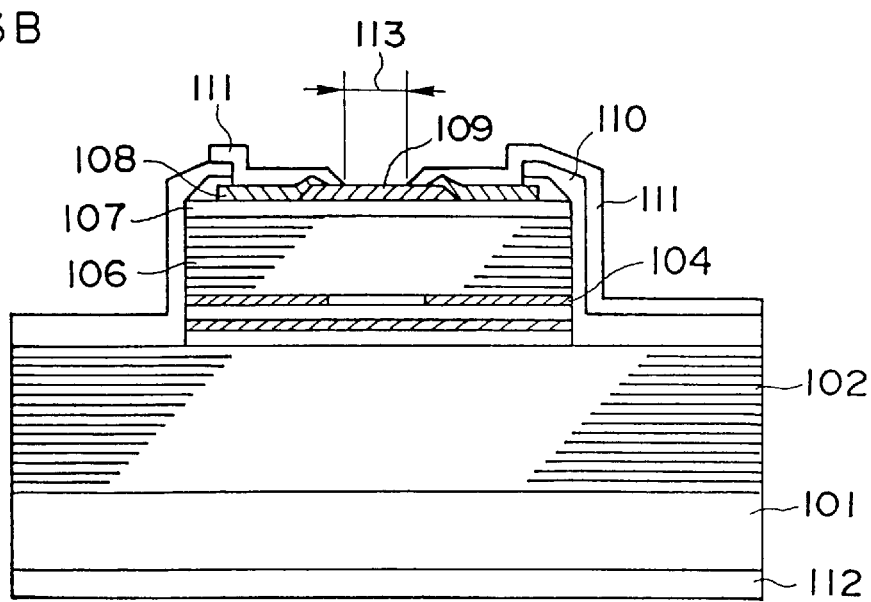

As in Example 6, after the steps shown in FIGS. 11A to 11I have been carried out, in order to form a p-type wiring electrode 819 connected to the contact electrode at the upper part of the post structure of the VCSEL thin film substrate, as shown in FIGS. 13A and 13B, a contact electrode is formed so as to come into contact with a substantially flat surface of the protective layer, and an opening with a small diameter restricted by the p-type wiring electrode is formed. The p-type wiring electrode can be formed at the final stage of the fabrication process, and thus, the electrode can be formed so as to correct dispersion in the preceding process.

FIGS. 13A and 13B are top and side sectional views showing an example of the vertical resonator type surface light emitting semiconductor laser device according to the present invention.

As in Example 6, laser light having low contact resistance and high output is produced by applying a low voltage, and there is fabricated a vertical resonator type surface light emitting semiconductor laser device having high reliability and in which there is no lowering of laser output over time.

EXAMPLE 9

In the steps (FIGS. 11A to 11J) similar to those shown in Example 6, in order to form a contact electrode at the upper part of the post structure of the VCSEL thin film substrate, as shown in FIGS. 14A and 14B, a contact electrode is formed so as to be positioned in an inclined region (tapered region) 116b of the protective film 109, instead of the region at which the one end of a contact electrode 108 at the side at which the opening is formed is flat.

In the vertical resonator type surface light emitting semiconductor laser device according to the present invention as shown in FIGS. 14A and 14B, a reflection body that includes a DBR layer 106 (second conductivity type semiconductor multi-layered reflection mirror), a contact layer 107, and a protective film 109 at an opening 113 of a contact electrode 108 is set so that the reflectance increases as the film thickness of the protective film is thicker in the inclined tapered region 116a, and the reflectance is maximal in the exposed substantially flat region 115. In this manner, the wave guide in the transverse direction of the laser can be substantially narrower than an opening formed by employing the contact electrode. In addition, the taper angle or shape of the taper region is controlled as required, whereby a desired beam diameter or oscillation mode can be selected.

EXAMPLE 10

Figure 15A:
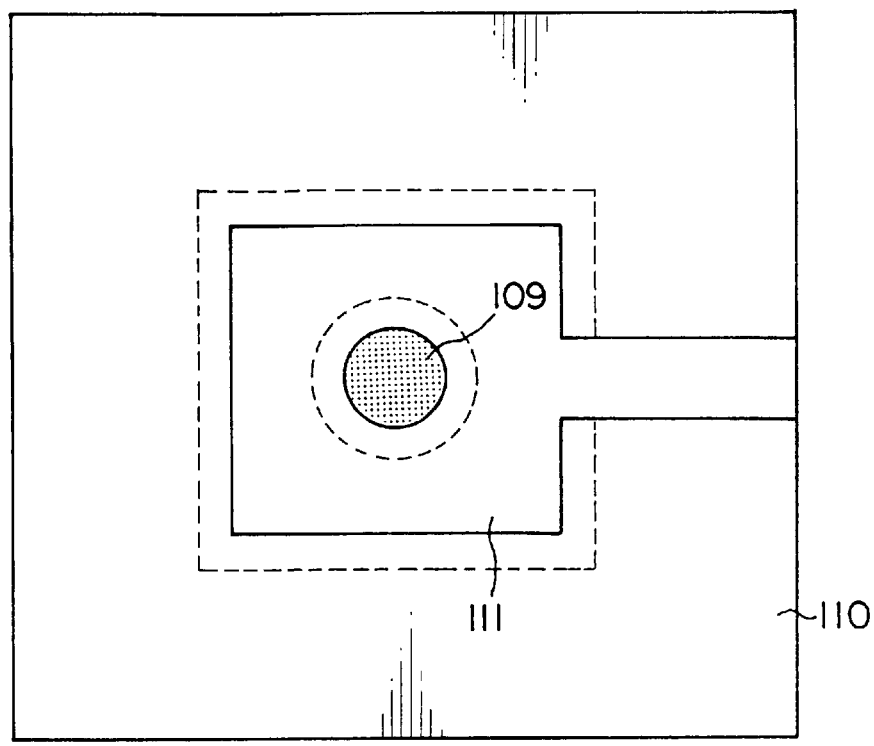
FIGS. 15A and 15B are top and side sectional views showing an example of the vertical resonator type surface light emitting semiconductor laser device according to the second aspect of the present invention.
Figure 15B:
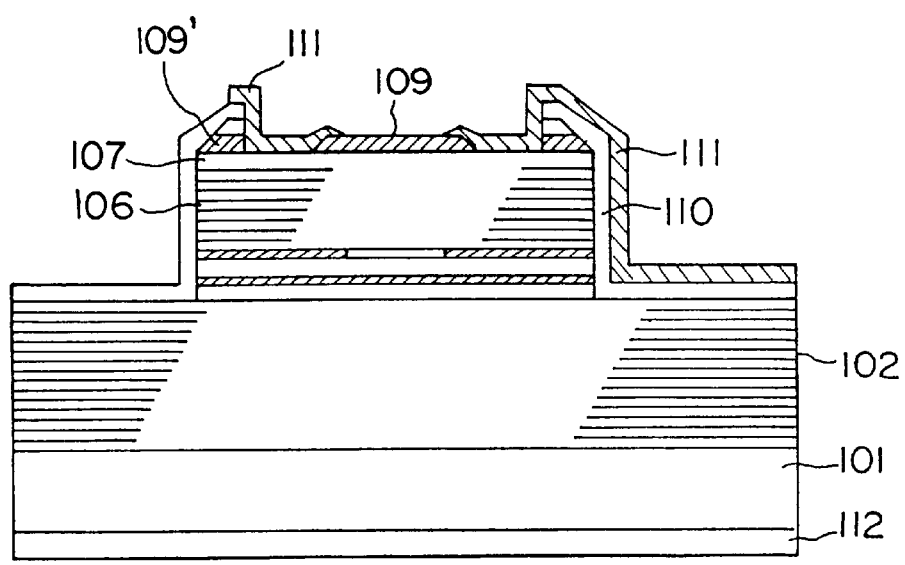

The vertical resonator type surface light emitting semiconductor laser device (the second embodiment of the present invention) having a structure similar to that shown in FIGS. 15A and 15B is fabricated as follows.

In Example 6, a post etching mask is provided at a region that is not covered with a protective film 109 and a contact electrode 108 at the upper part of the post structure of the VCSEL thin film substrate. In contrast, in the present Example, a protective film forming layer 109' is provided in this region at the same time as when the protective film is formed.

Hereinafter, a specific method of fabricating an AlAs oxidized VCSEL according to this Example (second embodiment) will be described with reference to FIGS. 16A to 16H by way of example.

(1) Fabricating a VCSEL Thin Film Substrate (Semiconductor Substrate)

Figure 16A:
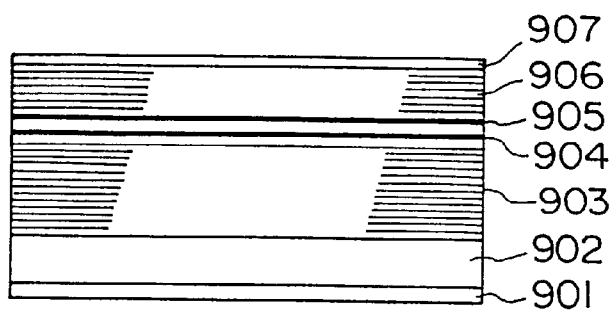
FIGS. 16A and 16H are illustrative views partially illustrating an example of the method of fabricating the vertical resonator type surface light emitting semiconductor laser device according to the second aspect of the present invention.

As in Example 6, a VCSEL thin film substrate as shown in FIG. 16A is fabricated by using the MOVPE method.

Figure 16B:
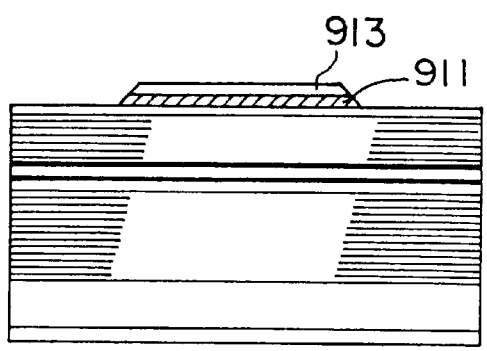

(2) Patterning a Mask by Film Depositing and Etching a Post Etching Mask Material First, a $SiN_x$ film is film deposited by the CVD method or sputtering or the like on the entire surface of a contact layer 907 that is the outermost later of the VCSEL thin film substrate fabricated by the MOVPE method. Further, a $SiO_xN_y$ film is film deposited on the layer to be laminated as a dry etching mask. Then, in order to perform processing for a columnar post structure, a resist is further formed on the $SiN_x$ film by general photolithography, and the resist is employed as a mask. Then, patterning is carried out by wet etching employing a fluoric acid based etchant, the resist is removed, and a laminate section of the patterned post etching mask 913 and protective film forming layer 911 is formed (FIG. 16B).

(3) Forming a Post Structure and AlAs Oxidization Step

Figure 16C:
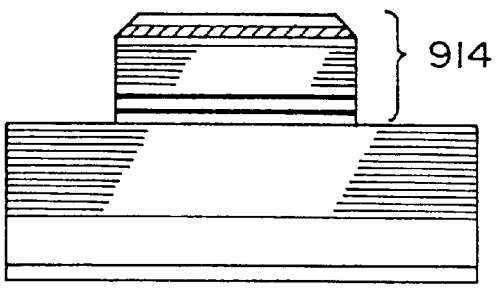
Figure 16D:
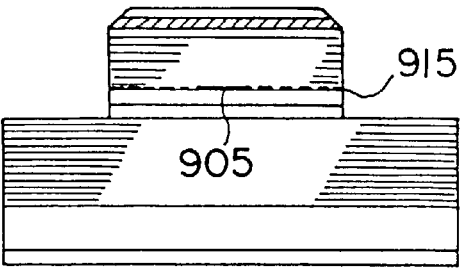

Next, a portion other than etching mask 913 is formed in the manner similar to (6) of Example 6, and a post structure 914 as shown in FIG. 16C is formed. At this time, a cross section of the laminate film of the VCSEL thin film substrate is exposed on the post side face. Then, immediately after the post structure is fabricated in the manner similar to (7) of Example 6, the fabricated structure is inserted into an annealing furnace, steam is introduced, and the AlAs layer is selectively oxidized from the post side face (refer to FIG. 16D).

(4) Film Depositing an Inter-layer Insulating Film

Figure 16E:
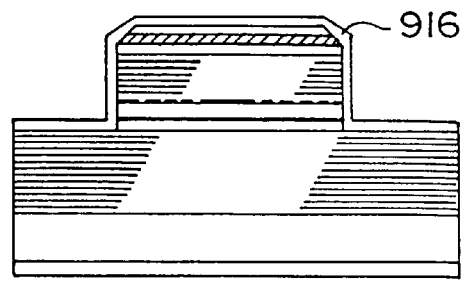

After AlAs oxidation is carried out, as shown in FIG. 16E, an $SiO_xN_y$ film is film deposited by the CVD method or sputtering or the like, and the entire post is fully covered with the inter-layer insulating film 916 made of $SiO_xN_y$ film.

(5) Forming a Contact Hole 1

Figure 16F:
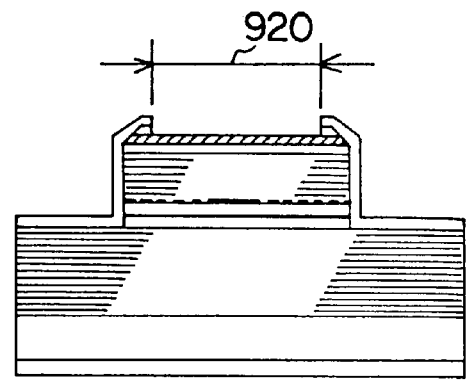
Figure 16G:
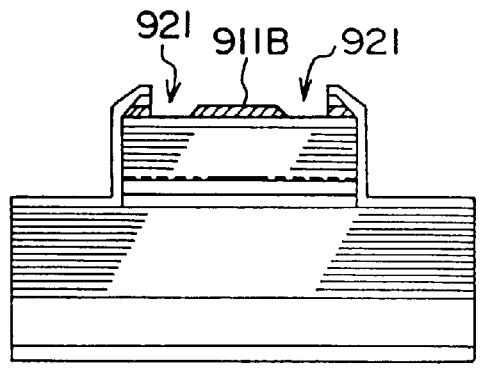

A resist is further formed on the inter-layer insulating film 916 by general photolithography, and the resist is employed as a mask. Then, the inter-layer insulating film 916 and the post etching mask 913 are etched by dry etching, and the contact hole forming via 920 is formed (FIG. 16F). The dry etching conditions are selected such that the inter-layer insulating film 916 and the post etching mask 913 can be selectively etched, and the protective film 911B is hardly etched.

(6) Forming a Contact Hole 2

A resist is further formed by general lithography, and the resist is employed as a mask. Then, the protective film 911B and a contact hole 921 are formed by wet etching or dry etching.

(7) Forming a p-type Wiring Electrode (Contact Electrode)

Figure 16H:
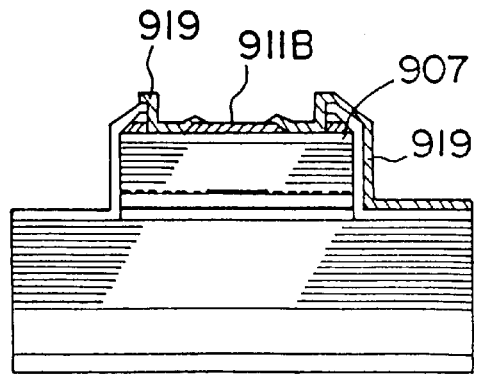

Last, as in (10) of Example 6, a p-type wiring electrode 919 made of Ti and Au is formed in contact with the contact layer 907 exposed in the contact hole 921, and there is fabricated a vertical resonator type surface light emitting semiconductor laser device according to the present invention, which has the sectional structure shown in FIG. 16H. The p-type electrode (contact electrode) may be made of AuZn/Au, Ti/Pt/Au or the like as well as Ti and Au.

In the foregoing, the wiring electrode is formed so as to also serve as the contact electrode without forming an additional contact electrode, enabling manufacture by a simpler process. In addition, laser light with a low contact resistance and high output is produced by applying a low voltage. Moreover, there is fabricated a vertical resonator type surface light emitting semiconductor laser device having high reliability without a decrease in laser output over time.

EXAMPLE 11

Figure 17A:
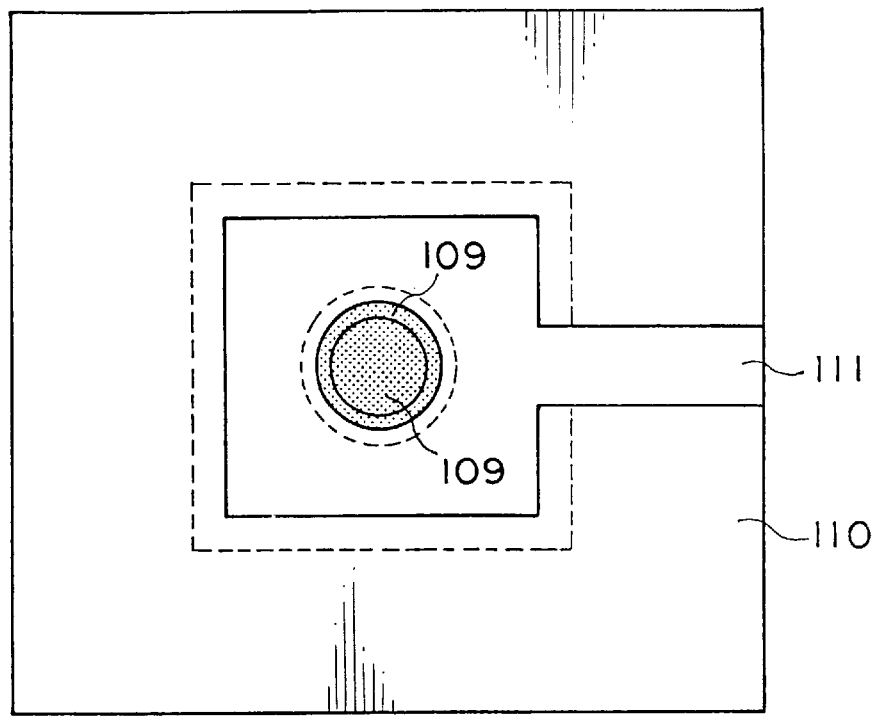
FIGS. 17A and 17B are top and sectional views showing an example of the vertical resonator type surface light emitting semiconductor laser device according to the second aspect of the present invention.
Figure 17B:
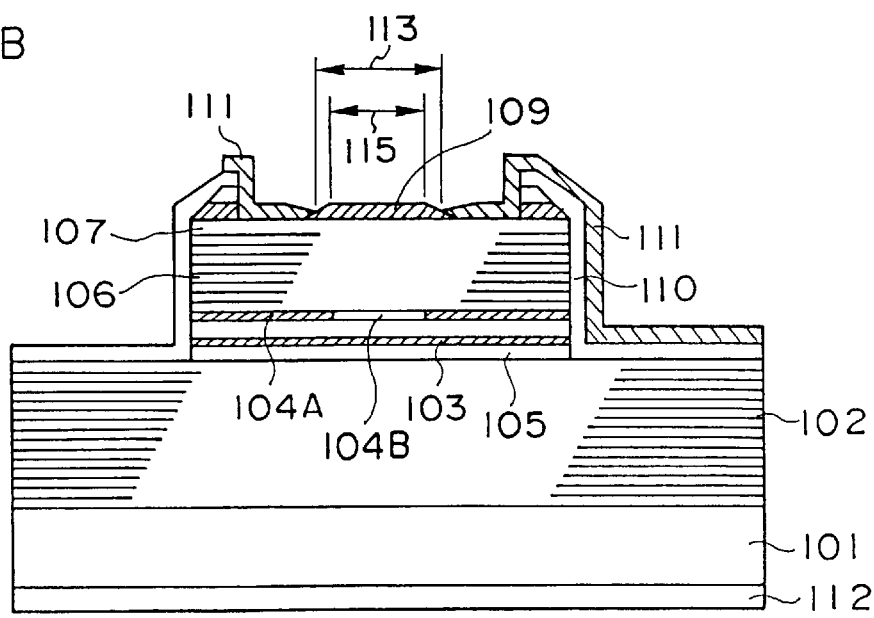

In a step (FIGS. 16A to 16H) similar to that in Example 10, in order to form a contact electrode at the upper part of the post structure of the VCSEL thin film structure, as shown in FIGS. 17A and 17B, an opening is formed by the p-type wiring electrode 919 so that one end of the opening is positioned in an inclined region (tapered region) instead of a flat region of the protective film 109.

In the vertical resonator type surface light emitting semiconductor laser device according to the present invention, as shown in FIG. 17A and 17B, a DBR layer 106 (second conductivity type semiconductor multi-layered reflection mirror), a contact layer 107, and a protective film 109 at an opening 113 of a contact electrode 108 are set so that the reflectance increases as the film thickness of the protective film is thicker in the inclined tapered region 114, and the reflectance is maximal in the exposed substantially flat region 113. In this manner, the wave guide in the transverse laser direction can be substantially narrower than an opening formed by employing the contact electrode. In addition, the taper angle or shape of the taper region are controlled as required, whereby a desired beam diameter or oscillation mode can be selected.

What is claimed is:

1. A vertical resonator type surface light emitting semiconductor laser device having sequentially provided thereon a semiconductor substrate comprising: a first conductivity type semiconductor multi-layered film reflection mirror; an active layer; an oxidized emitting port formed by steam oxidation; a second conductivity type semiconductor multi-layered film reflection mirror; a second conductivity type contact layer; a contact electrode having an opening for emitting laser light; a protective film for protecting said opening; an insulating film; a wiring electrode formed on said insulating film; and an electrode having a conductivity type that is different from said contact electrode, wherein a surface area of said protective film is greater than an area of the opening of the contact electrode and smaller than an area of the contact electrode to prevent damage due to fabrication after forming said contact electrode, and a contact hole is formed in said insulating film so as to include therein the protective film positioned in said opening, a size of said contact hole being smaller than an area of said contact electrode, and said contact hole connecting said wiring electrode and said contact electrode.

2. A vertical resonator type surface light emitting semiconductor laser device according to claim 1, wherein said wiring electrode is bonded with said contact electrode and is provided at a position at which the wiring electrode is superimposed on the protective film.

3. A vertical resonator type surface light emitting semiconductor laser device having sequentially provided thereon a semiconductor substrate comprising: a first conductivity type semiconductor multi-layered film reflection mirror; an active layer; an emitting port; a second conductivity type semiconductor multi-layered film reflection mirror; a second conductivity type contact layer; a protective film; a contact electrode having an opening for emitting laser light; and an electrode having a conductivity type that is different from said contact electrode, wherein said protective film is formed as a first layer on said contact layer, said contact electrode is provided on said protective film, a size of said protective film being greater than a size of said opening and smaller than a surface area of said contact electrode.

4. A vertical resonator type surface light emitting semiconductor laser device according to claim 3, wherein an insulating film is provided in a region at which the protective film is not formed or on a contact layer, and a region corresponding to the contact hole at which neither the insulating film nor the protective film is formed is covered with a contact electrode.

5. A vertical resonator type surface light emitting semiconductor laser device according to claim 1, wherein a film thickness of the protective film satisfies the following condition:

$$d=(\lambda/2)*(N/n)$$

wherein d denotes the film thickness of the protective film, $\lambda$ denotes a wavelength of the laser light, n denotes a reflectance of said protective film, and N is a nonnegative integer.

6. A vertical resonator type surface light emitting semiconductor layer device according to claim 3, wherein a protective film formed on said contact layer includes a substantially flat region and an inclined region at a side free from contact with said semiconductor multi-layered film reflection mirror or contact layer, and an opening of the contact electrode is formed at an upper surface of the substantially flat region or at a lower portion of the inclined region as viewed from a thickness direction of the protective film, and a film thickness of the protective film in the substantially flat region satisfies the following condition:

$$d=(\lambda/2)*(N/n)$$

wherein d denotes the film thickness of the protective film, $\lambda$ denotes a wavelength of the laser light, n denotes a reflectance of said protective film, and N is a nonnegative integer.

7. A vertical resonator type surface light emitting semiconductor laser device according to claim 1, wherein the protective film is selected from among an $SiO_2$ film, $SiO_xN_y$ film, a $SiN_x$ film, and $In_xSn_yO_z$ film.

8. A method of fabricating a vertical resonator type surface light emitting semiconductor laser device comprising the steps of:

forming, in order on a semiconductor substrate, a first conductivity type semiconductor multi-layered film reflection mirror, an active layer, a semiconductor layer to be oxidized, a second conductivity type semiconductor multi-layered film reflection mirror, a second conductivity type contact layer, and a contact electrode having an opening for emitting laser light;

forming a protective film for protecting the opening of the contact electrode from damage due to fabrication after forming said contact electrode, a surface area of said protective film being greater than an area of the opening of the contact electrode and smaller than an area of the contact electrode;

etching the semiconductor layer to be oxidized to expose an edge thereof;

oxidizing the semiconductor layer to be oxidized from the edge by steam to form a emitting port;

laminating an insulating film;

forming a contact hole in said insulating film so as to include therein the protective film positioned in said opening, a size of said contact hole being smaller than an area of said contact electrode, and said contact hole connecting said wiring electrode and said contact electrode; and forming a electrode having a conductivity type that is different from that of the contact electrode.

9. A vertical resonator type surface light emitting semiconductor laser device according to claim 3, wherein said emitting port is formed by steam oxidation.

10. A vertical resonator type surface light emitting semiconductor laser device according to claim 1, wherein the protective film is one of an $SiO_2$ film and an $SiO_xN_y$ film, and the insulating film is an $SiN_x$ film.

11. A vertical resonator type surface light emitting semiconductor laser device according to claim 3, wherein the protective film is one of an $SiO_2$ film and an $SiO_xN_y$ film, and the insulating film is an $SiN_x$ film.

* * * * *